United States Patent
Mauder et al.

(10) Patent No.: US 10,109,489 B2
(45) Date of Patent: Oct. 23, 2018

(54) METHOD FOR PRODUCING A SUPERJUNCTION DEVICE

(71) Applicant: Infineon Technologies Austria AG, Villach (AT)

(72) Inventors: Anton Mauder, Kolbermoor (DE); Hans Weber, Bayerisch Gmain (DE); Franz Hirler, Isen (DE); Johannes Georg Laven, Taufkirchen (DE); Hans-Joachim Schulze, Taufkirchen (DE); Werner Schustereder, Villach (AT); Maximilian Treiber, Munich (DE); Daniel Tutuc, St. Niklas an der Drau (AT); Andreas Voerckel, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/648,987

(22) Filed: Jul. 13, 2017

(65) Prior Publication Data

US 2018/0019132 A1 Jan. 18, 2018

(30) Foreign Application Priority Data

Jul. 14, 2016 (DE) .................... 10 2016 112 970
Mar. 8, 2017 (DE) .................... 10 2017 104 787

(51) Int. Cl.
*H01L 21/265* (2006.01)
*H01L 29/06* (2006.01)
*H01L 29/66* (2006.01)
*H01L 29/78* (2006.01)

(52) U.S. Cl.
CPC .... *H01L 21/26586* (2013.01); *H01L 29/0634* (2013.01); *H01L 29/0696* (2013.01); *H01L 29/66712* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 8,860,098 B2 | 10/2014 | Bhalla et al. | |
| 9,171,949 B1 | 10/2015 | Padmanabhan et al. | |
| 2010/0044791 A1* | 2/2010 | Hebert | H01L 29/0634 257/341 |
| 2014/0217496 A1* | 8/2014 | Kachi | H01L 29/0696 257/330 |

* cited by examiner

*Primary Examiner* — Asok K Sarkar
(74) *Attorney, Agent, or Firm* — Murphy, Bilak & Homiller, PLLC

(57) ABSTRACT

Disclosed is a method that includes forming a plurality of semiconductor arrangements one above the other. In this method, forming each of the plurality of semiconductor arrangements includes: forming a semiconductor layer; forming a plurality of trenches in a first surface of the semiconductor layer; and implanting dopant atoms of at least one of a first type and a second type into at least one of a first sidewall and a second sidewall of each of the plurality of trenches of the semiconductor layer.

26 Claims, 14 Drawing Sheets

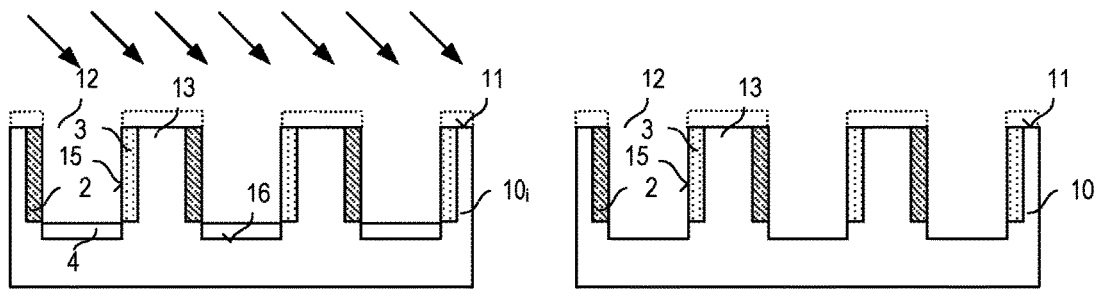
FIG 12C  FIG 12D
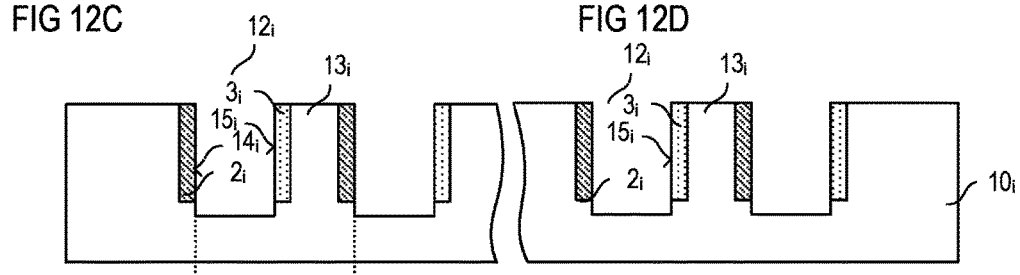
FIG 13A
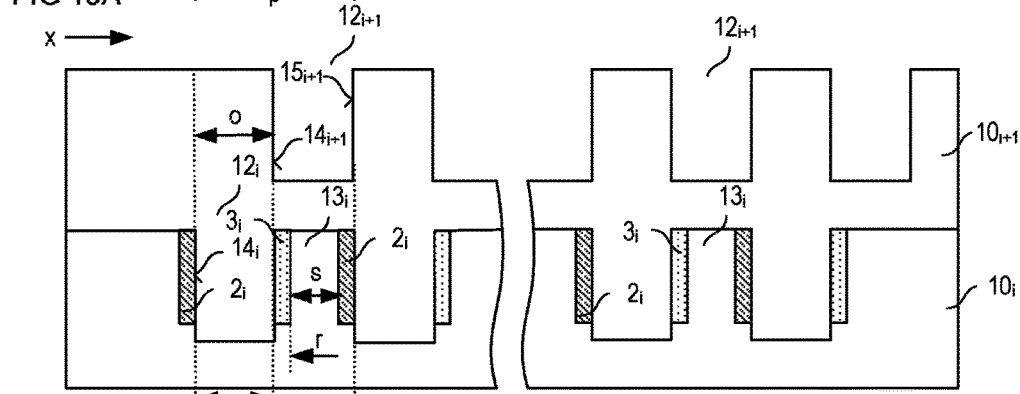
FIG 13B
FIG 13C

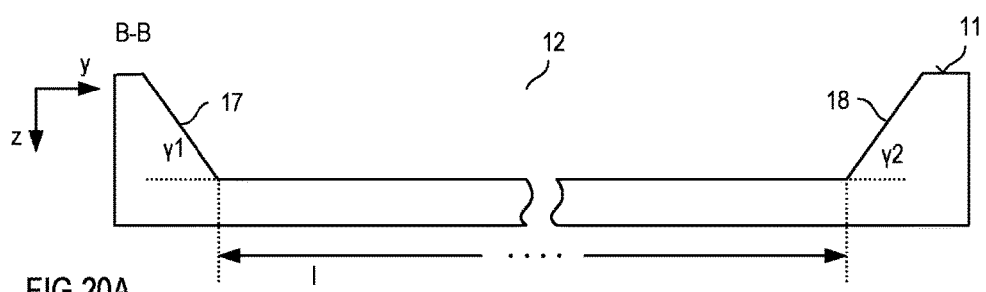
FIG 20A
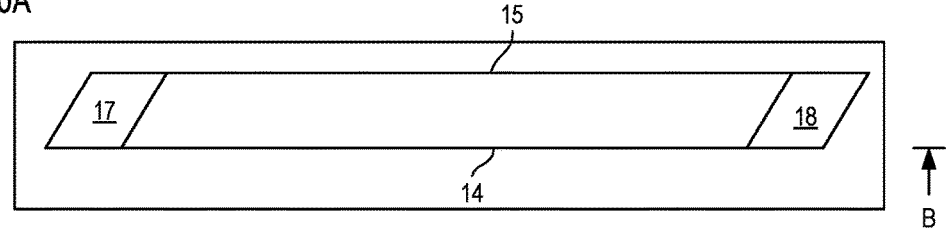
FIG 20B
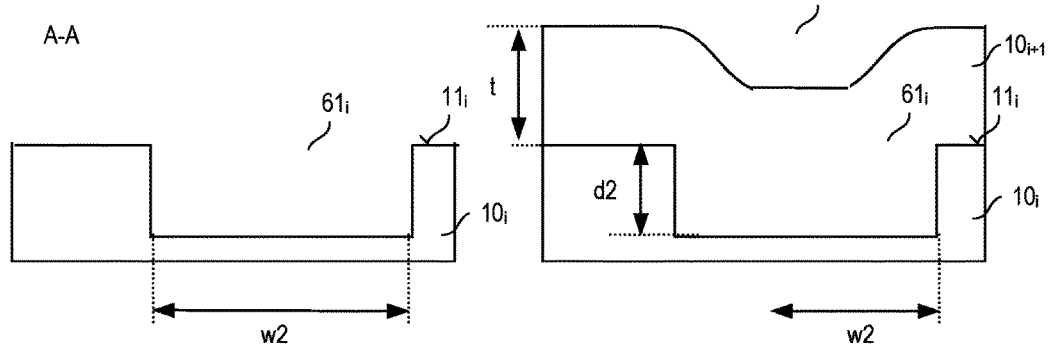
FIG 21A
FIG 21B

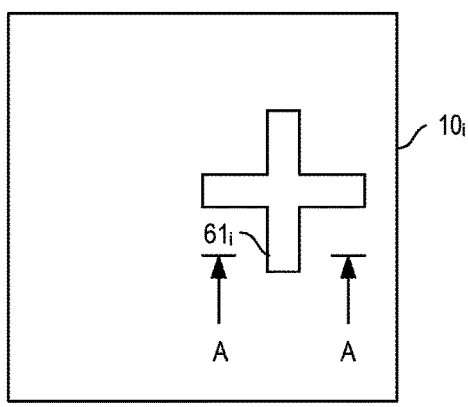
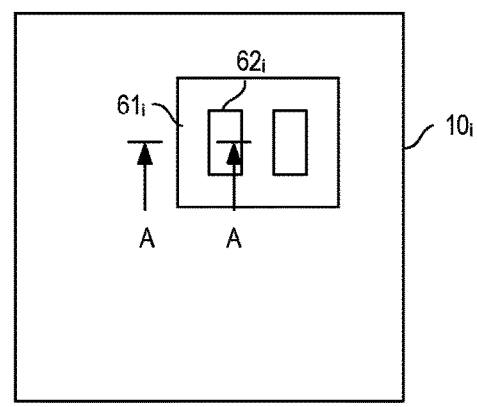
FIG 22A
FIG 22B

METHOD FOR PRODUCING A SUPERJUNCTION DEVICE

TECHNICAL FIELD

This disclosure in general relates to a method for producing a superjunction device, in particular for producing a drift region with n-type regions and p-type regions in a superjunction device.

BACKGROUND

A superjunction device, which often is also referred to as compensation device, includes a drift region with at least one region of a first doping type (conductivity type) and at least one region of a second doping type (conductivity type) complementary to the first doping type. In some publications, the at least one region of the first doping type is referred to as drift region and the at least one region of the second doping type is referred to as compensation region.

A superjunction device can be operated in an on-state and an off-state. The on-state is an operation mode in which a current can flow in a current flow direction through the first doping type region. The off-state is an operation mode in which a pn-junction between the at least one first doping type region and the at least one second doping type region is reverse biased so that a space charge region (depletion region) expands in each of these doped regions in directions that are substantially perpendicular to the current flow direction.

A voltage blocking capability of a superjunction device is, inter alia, dependent on how well the amount of first type doping atoms in the first doping type region is adapted to the amount of second type doping atoms in the second doping type region. More precisely, the voltage blocking capability is dependent on how well the amount of first type doping atoms is adapted to the amount of second type doping atoms at each position in the current flow direction of the drift region. One device may include planes (extending perpendicular to the current flow direction) of the drift region where the amount of first type doping atoms and the amount of second type doping atoms is completely balanced, positions where the amount of first type doping atoms exceeds the amount of second type doping atoms, and/or positions where the amount of second type doping atoms exceeds the amount of first type doping atoms. However, in each of these cases it is desirable to exactly control the amount of first type and second type doping atoms introduced into the drift region during a manufacturing process.

SUMMARY

One example relates to a method for forming at least one semiconductor arrangement. In this method, forming the at least one semiconductor arrangement includes forming a semiconductor layer, forming a plurality of trenches in a first surface of the semiconductor layer, and implanting dopant atoms of at least one of a first type and a second type into at least one of a first sidewall and a second sidewall of each of the plurality of trenches in the semiconductor layer.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings, the same reference characters denote like features.

FIGS. 12A-12D shows another example of the process shown in FIGS. 1C and 1D in greater detail;

FIGS. 13A-13D show a modification of the method shown in FIGS. 1A-1F;

FIGS. 20A and 20B shows a cross sectional view and a top view of a trench with beveled longitudinal sidewalls;

FIGS. 21A and 21B illustrate a method for producing a trench of an alignment structure; and FIGS. 22A and 22B show top views of two different alignment structures which each include an alignment trench as shown in FIG. 21A.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

One example relates to a method for forming a semiconductor structure that includes a plurality of first type and second type semiconductor regions. The first type regions include dopants of a first doping type (conductivity type) and have an effective doping concentration of the first type, and the second type regions include dopants of a second doping type (conductivity type) complementary to the first type and have an effective doping concentration of the second type. This semiconductor structure with the plurality of first type and second type semiconductor regions, for example, may form a drift region of a superjunction device. Forming such semiconductor structure may include forming a plurality (that is, two or more) semiconductor arrangements one above the other. FIGS. 1A-1F illustrate one example of how two semiconductor arrangements may be formed one above the other. According to another example explained herein further below, forming such semiconductor structure with a plurality of first type and second type semiconductor regions includes forming only one semiconductor arrangement of the type explained with reference to FIG. 1.

Figure 1A:
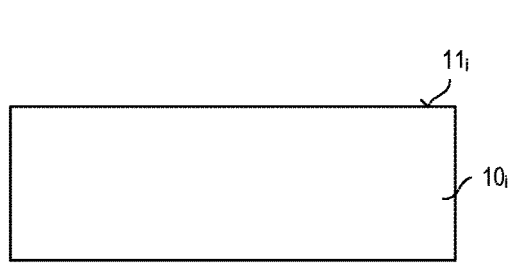
FIGS. 1A-1F illustrates one example of a method for producing a plurality of semiconductor arrangements one above the other, with each semiconductor arrangement including a semiconductor layer, a plurality of trenches in the semiconductor layer, and implanted regions along opposite sidewalls of the trenches.

Referring to FIG. 1A, the method includes forming a semiconductor layer $10_i$ with a first surface $11_i$. FIG. 1A shows a vertical cross-sectional view of the semiconductor layer $10_i$, that is, a view in a section plane perpendicular to the first surface $11_i$. According to one example, the semiconductor layer $10_i$ is a monocrystalline layer and a material of the semiconductor layer is silicon.

Figure 1B:
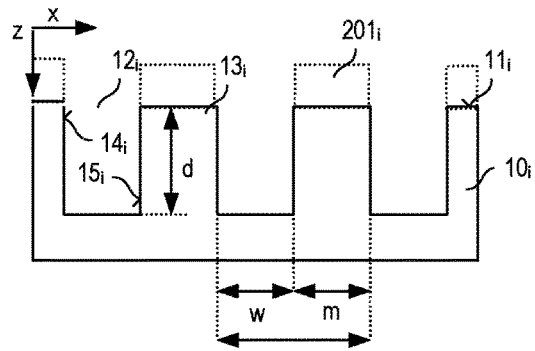

Referring to FIG. 1B, the method further includes forming a plurality of trenches $12_i$ in the first surface $11_i$ of the semiconductor layer $10_i$. According to one example, the trenches $12_i$ are formed such that they are elongated in a direction perpendicular to the section plane shown in FIG. 1B. "Elongated" means that a length of the trenches $12_i$ in this direction perpendicular to the section plane is several times a width w of the trenches $12_i$. According to one example, the length l of each of the trenches $12_i$ is at least 10 (1E1), at least 100 (1E2), at least 1000 (1E3) times, or at least 10000 (1E4) times the width w. According to one example, the trenches are formed to have an aspect ratio, which is a ratio between a depth d and the width w, of between 10:1 and 1:1, in particular between 6:1 and 1:1. The width w of the trenches is their dimension in a first lateral direction x, and the depth is their dimension in a vertical direction z. The vertical z direction is perpendicular to the first lateral direction x and the first surface $11_i$. The lateral direction perpendicular to the section plane shown in FIG. 1B, that is, perpendicular to the first lateral direction x (and the vertical direction z) is referred to as second lateral direction y in the following.

According to one example, the trenches $12_i$ are formed to have a width w of between 0.5 micrometers (μm) and 6 micrometers, in particular between 1 micrometer and 3 micrometers. Referring to FIG. 1B, the trenches $12_i$ are separated by mesa regions $13_i$, which are sections of the semiconductor layer $10_i$ remaining between the trenches $12_i$ after the etching process. According to one example, a width m of these mesa regions $13_i$ in the lateral direction x is between 0.5 micrometers (μm) and 6 micrometers, in particular between 1 micrometer and 3 micrometers. Consequently, a pitch, which is given by the width w of one trench $12_i$ and the width m of one mesa region $13_i$ adjoining the respective trench $12_i$, is between 1 micrometer (μm) and 12 micrometers, in particular between 2 micrometers and 6 micrometers.

According to one example, the trenches $12_i$ have substantially the same width. According to one example, the trenches are substantially equally spaced in the first lateral direction x of the semiconductor layer $10_i$, that is, the mesa regions have substantially the same width.

Forming the plurality of trenches $12_i$ may include forming an etch mask $201_i$ (illustrated in dashed lines in FIG. 1B) on the first surface $11_i$ and etching the semiconductor layer $10_i$ in those regions of the first surface $11_i$ that are not covered by the etch mask $201_i$. According to one example, the etching process is a wet etching process using an alkaline etchant. Examples of an alkaline etchant include, but are not restricted to, TMAH (Tetramethylammoniumhydroxide), KOH, CaOH, or NH$_4$OH. According to one example, a temperature in the etching process is about 80° C. and a concentration of the etchant is between 20% and 30%, in particular about 25%.

According to one example, the semiconductor layer $10_i$ is a monocrystalline silicon layer and formed such that the first surface $11_i$ is in a {110} plane of a crystal lattice of the silicon layer and that each of a first surface $14_i$ and second surface $15_i$ opposite the first surface $14_i$ of each of the plurality of trenches is in a {111} plane of the crystal lattice of the silicon layer. Consequently, edges of the trenches $12_i$ between the first surface $11_i$ and each of the first sidewall $14_i$ and the second sidewall $15_i$ run in a <112> direction of the trenches $12_i$.

Figure 1C:
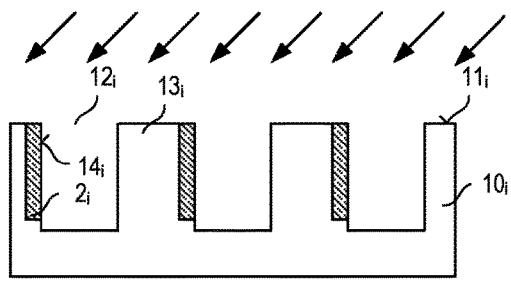
Figure 1D:
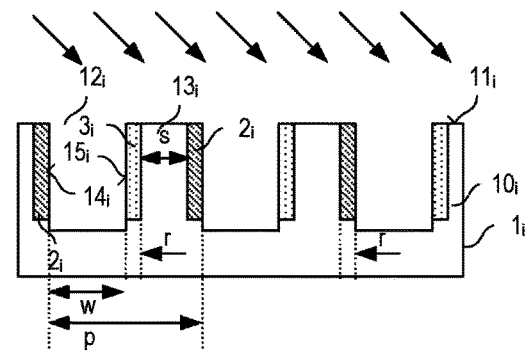

The method further includes implanting dopant atoms of at least one of a first type and a second type into at least one of the first sidewall $14_i$ and the second sidewall $15_i$ of each of the plurality of trenches $12_i$. In the example method shown in FIGS. 1A to 1F, implanting the dopant atoms includes implanting first type dopant atoms into the first sidewalls $14_i$ of the plurality of trenches $12_i$ and implanting second type dopant atoms into the second sidewalls $15_i$ of the plurality of trenches $12_i$. Implanting the first type dopant atoms into the first sidewalls $14_i$ is illustrated in FIG. 1C, and implanting the second type dopant atoms into the second sidewalls $15_i$ is illustrated in FIG. 1D. Implanting the first type dopant atoms results in first type regions $2_i$ along the first sidewalls $14_i$, and implanting the second type dopant atoms results in second type regions $3_i$ along the second sidewalls $15_i$. In the semiconductor arrangement $1_i$ shown in FIG. 1D, a distance between the first type region $2_i$ at the first sidewall $14_i$ of the trench $12_i$ and the second type region $3_i$ at the second sidewall $15_i$ of the trench $12_i$ is given by the width w of the trench $12_i$. In FIG. 1D, s denotes the distance between the first type region $2_i$ and the second type region $3_i$ arranged in the same mesa region $13_i$. Furthermore, r denotes a dimension of the first type region $2_i$ and the second type region $3_i$ in the first lateral direction x. According to one example, the first type region $2_i$ and the second type region $3_i$ are substantially equally spaced, so that s≈w. This can be achieved by forming the trenches $12_i$ with a width w which is given by w=p/2−r, where p is the pitch and r is the dimension of each of the first type regions $2_i$ and the second type regions $3_i$ in the first lateral direction x.

The processing illustrated in FIGS. 1A-1D which includes forming the semiconductor layer $10_i$, forming a plurality of trenches $12_i$ in the first surface $11_i$ of the semiconductor layer $10_i$ and implanting dopant atoms of at least one of a first type and a second type into at least one of the first sidewall and a second sidewall of each of the plurality of trenches $12_i$ forms one of the plurality of semiconductor arrangements. This semiconductor arrangement is referred to as $1_i$ in FIG. 1D. Forming another semiconductor arrangement $1_{i+1}$ on top of the semiconductor arrangement $1_i$ shown in FIG. 1D includes the same processing as explained with reference to FIGS. 1A to 1D.

In the following, two semiconductor arrangements formed one above the other are referred to as pair of semiconductor arrangements, wherein the semiconductor arrangement that is formed first is referred to as bottom semiconductor arrangement and the semiconductor arrangement formed on the bottom semiconductor arrangement is referred to as top semiconductor arrangement. Consequently, the semiconductor arrangement shown in FIG. 1D is also referred to as bottom semiconductor arrangement, and the semiconductor arrangement $1_{i+1}$ that is formed in the processing explained with reference to FIG. 1E-1F below is also referred to as top semiconductor arrangement. Equivalently, the semiconductor layer $10_i$ of the bottom semiconductor arrangement is referred to as bottom semiconductor layer, and a semiconductor layer $10_{i+1}$ of the top semiconductor arrangement $1_{i+1}$ is referred to as top semiconductor layer. It should be noted that the terms "bottom" and "top" merely describe the relative relationship between two semiconductor arrangements, with the semiconductor arrangement referred to as "bottom semiconductor arrangement" being the one that is formed before the semiconductor arrangement referred to as "top semiconductor arrangement". That is, in a structure with more than two semiconductor arrangements, one and the same semiconductor arrangement can be referred to as top semiconductor arrangement relative to one semiconductor arrangement and as bottom semiconductor arrangement relative to another semiconductor arrangement.

Figure 1E:
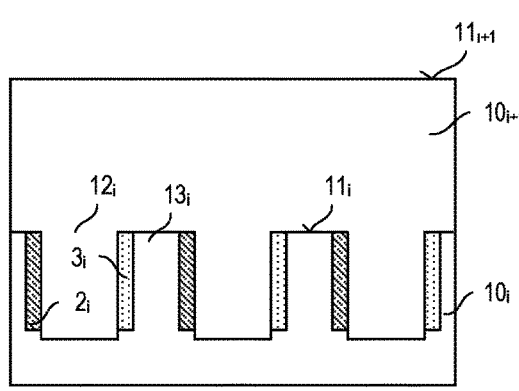

Referring to FIG. 1E, forming the top semiconductor arrangement $1_{i+1}$ includes forming the top semiconductor layer $10_{i+1}$ on the bottom semiconductor layer $10_i$. According to one example, and as shown in FIG. 1E, forming the top semiconductor layer $10_{i+1}$ on the bottom semiconductor layer $10_i$ includes forming the top semiconductor layer $10_{i+1}$ in the plurality of trenches $12_i$ and on top of the mesa regions $13_i$. According to one example, the top semiconductor layer $10_{i+1}$ is formed such that it completely fills the trenches $12_i$ and completely covers the mesa regions $13_i$. According to one example, the top semiconductor layer $10_{i+1}$ is formed to have a thickness such that the top semiconductor layer has a substantially planar first surface $11_{i+1}$. Optionally, the first surface $11_{i+1}$ is planarized using one of a chemical polishing process, a mechanical polishing process or chemical-mechanical polishing (CMP) process.

According to one example, forming the top semiconductor layer includes epitaxially growing the top semiconductor layer $10_{i+1}$ on the bottom semiconductor layer $10_i$. If, for example, the first surface $11_i$ of the bottom semiconductor layer $10_i$ is in a {110} plane of the crystal lattice, a first surface of the top semiconductor layer is in a {110} plane of the crystal lattice of the top semiconductor layer $10_{i+1}$. According to one example, epitaxially growing the top semiconductor layer $10_{i+1}$ includes epitaxially growing the top semiconductor layer $10_{i+1}$ at a growth rate of higher than 500 nanometers per minute or higher than 1 micrometer per minute. The "growth rate" as defined herein is the growth rate on a horizontal surface without trenches. The growth rate on the mesa regions $13_i$ is lower as the deposited material not only grows on the mesa regions $13_i$ but also fills the trenches $12_i$.

Figure 1F:
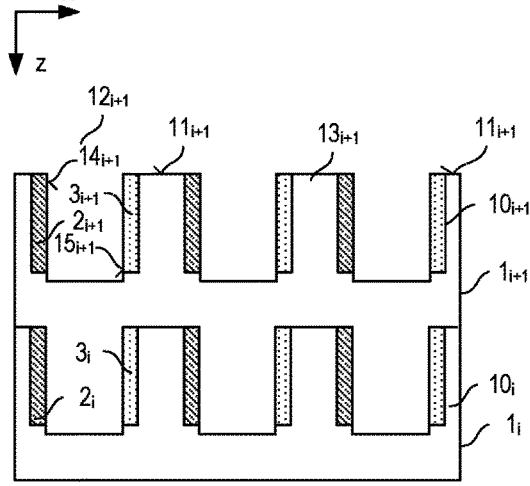

Referring to FIG. 1F, forming the top semiconductor arrangement $1_{i+1}$ further includes forming a plurality of trenches $12_{i+1}$ in a first surface $11_{i+1}$ of the top semiconductor layer $10_{i+1}$ and implanting dopant atoms of at least one of a first type and a second type into at least one of a first sidewall $14_{i+1}$ and a second sidewall $15_{i+1}$ of each of the plurality of trenches $12_{i+1}$ of the top semiconductor layer $10_{i+1}$. In the example shown in FIG. 1F, like in the bottom semiconductor arrangement $1_i$, dopant atoms of the first type are implanted into the first sidewalls $14_{i+1}$ of the trenches $12_{i+1}$, and dopant atoms of the second type are implanted into the second sidewalk $15_{i+1}$ of the trenches $12_{i+1}$. Everything that is explained with reference to the trenches $12_i$ of the bottom semiconductor arrangement $1_i$ herein above applies to the trenches $12_{i+1}$ of the top semiconductor arrangement $1_{i+1}$ accordingly. According to one example, a width of the trenches $12_{i+1}$ in the top semiconductor layer $10_{i+1}$ substantially equals the width w of the trenches $12_i$ in the bottom semiconductor layer $10_i$ and a width of the mesa regions $13_{i+1}$ of the top semiconductor layer $10_{i+1}$ substantially equals the width m of the mesa regions $13_i$ in the bottom semiconductor layer $10_i$.

According to one example, the trenches $12_{i+1}$ in the top semiconductor layer $10_{i+1}$ are formed such that the first sidewalls $14_{i+1}$ of these trenches are aligned with the first sidewalls $14_i$ of the trenches $12_i$ (which, when forming the trenches $12_{i+1}$ have already been filled with the semiconductor layer $10_{i+1}$) and the second sidewalls $15_{i+1}$ are aligned with the second sidewalls $15_i$ of the trenches $12_i$, so that first type regions $2_{i+1}$, resulting from implanting first type dopant atoms into the first sidewalls $14_{i+1}$ of the trenches $12_{i+1}$ in the top semiconductor arrangement $1_{i+1}$ are arranged above doped regions $2_i$ resulting from implanting first type dopant atoms into the first sidewalls $14_i$ of the trenches $12_i$ of the bottom semiconductor arrangement. Equivalently, doped regions $3_{i+1}$ resulting from implanting second type dopant atoms into the second sidewalls $15_{i+1}$ of the trenches $12_{i+1}$ in the top semiconductor arrangement $1_i$ are arranged above doped regions $3_i$ resulting from implanting second type dopant atoms into the second sidewalls $15_i$ of the trenches $12_i$ in the bottom semiconductor arrangement $10_{i+1}$.

In FIGS. 1A-1F, the bottom semiconductor arrangement and $1_i$ the top semiconductor arrangement $1_{i+1}$ and their respective features have like reference character that are only different in the subscript index, which is "i" in case of the bottom semiconductor arrangement $1_i$ and "i+1" in case of the top semiconductor arrangement $1_{i+1}$. In the following, if explanations equivalently apply to any of the semiconductor arrangements $1_i$, $1_{i+1}$ or to a feature of any of the semiconductor arrangements $1_i$, $1_{i+1}$ reference characters without index are used. That is, any one or the plurality of the semiconductor arrangements is referred to as "the semiconductor arrangement 1", any one or the plurality of the semiconductor layers $10_i$, $10_{i+1}$ is simply referred to as "the semiconductor layer 10", any one or the plurality of the trenches $12_i$, $12_{i+1}$ in the semiconductor layers $10_i$, $10_{i+1}$ is referred to as "the trenches 12", and so on.

Although not shown in FIGS. 1A-1F, the processing explained with reference to FIGS. 1E to 1F may be repeated several times to form more than two semiconductor arrangements of the same type as the bottom semiconductor arrangement $1_i$ and the top semiconductor arrangement $1_{i+1}$ shown in these figures one above the other.

Epitaxially growing the individual semiconductor layers $10_i$, $10_{i+1}$ results in a monocrystalline layer arrangement, whereas "layer arrangement" denotes the plurality of semiconductor layers formed one above the other. In the monocrystalline layer arrangement, there is no visible border between the individual epitaxial layers. Nevertheless, just for the purpose of illustration, borders between the individual layers are illustrated by lines in FIG. 1F and the following figures. FIGS. 1A-1F do not explicitly show where the bottom semiconductor layer $10_i$ is formed.

Figure 2:
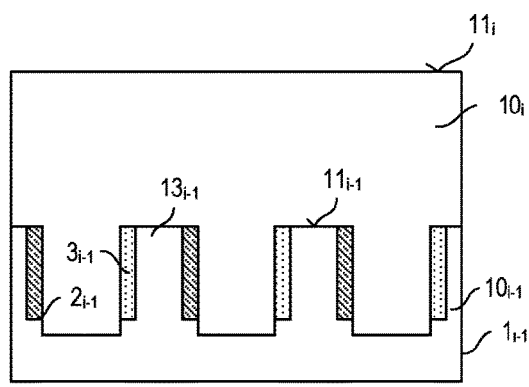
FIG. 2 shows one example of a structure below the semiconductor layer shown in FIG. 1A.

According to one example, shown in FIG. 2, the bottom semiconductor layer $10_i$ is formed on yet another semiconductor arrangement $1_{i-1}$ of the same type as the bottom and top semiconductor arrangements $1_i$, $1_{i+1}$, explained with reference to FIGS. 1A-1F. Relative to a semiconductor layer $10_{i+1}$ of this semiconductor arrangement $1_{i+1}$, the semiconductor layer $10_i$ is the top semiconductor layer.

Figure 3:
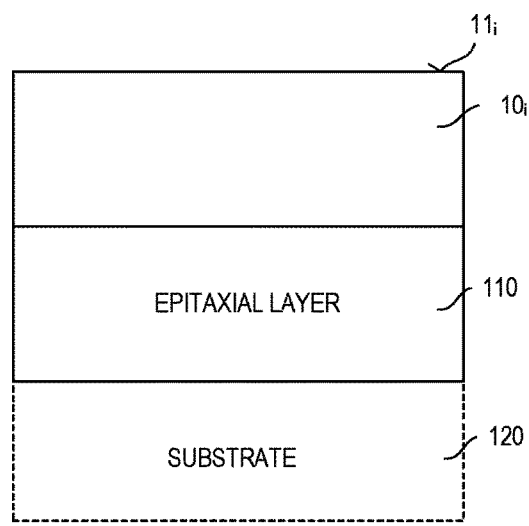
FIG. 3 shows another example of a structure below the semiconductor layer shown in FIG. 1A.

According to another example shown in FIG. 3, the bottom semiconductor layer $10_i$ is grown on an epitaxial layer 110. According to one example (illustrated in dashed lines in FIG. 3), the epitaxial layer 110 has been grown on a semiconductor substrate 120. According to one example, the epitaxial layer 110 has a substantially homogenous doping concentration.

Figure 4:
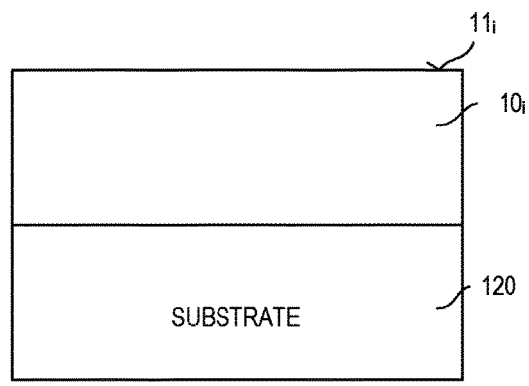
FIG. 4 shows another example of a structure below the semiconductor layer shown in FIG. 1A.

According to yet another example shown in FIG. 4, the semiconductor layer $10_i$ shown in FIG. 1A is grown on a semiconductor substrate 120. A substrate, for example, is a piece of monocrystalline semiconductor formed by or cut from a semiconductor wafer.

Figure 5A:
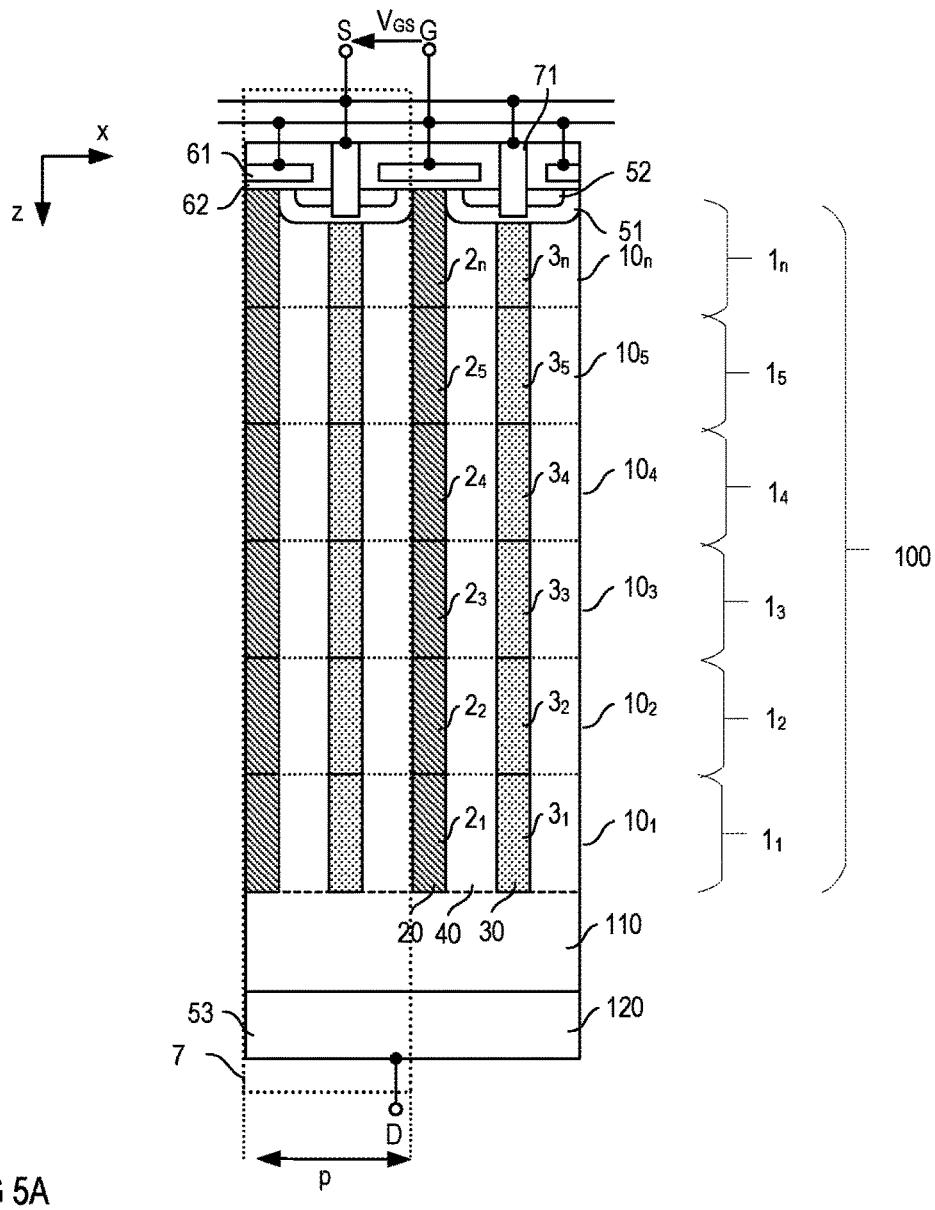
FIGS. 5A and 5B show semiconductor devices based on a structure with a plurality of semiconductor arrangements.
Figure 5B:
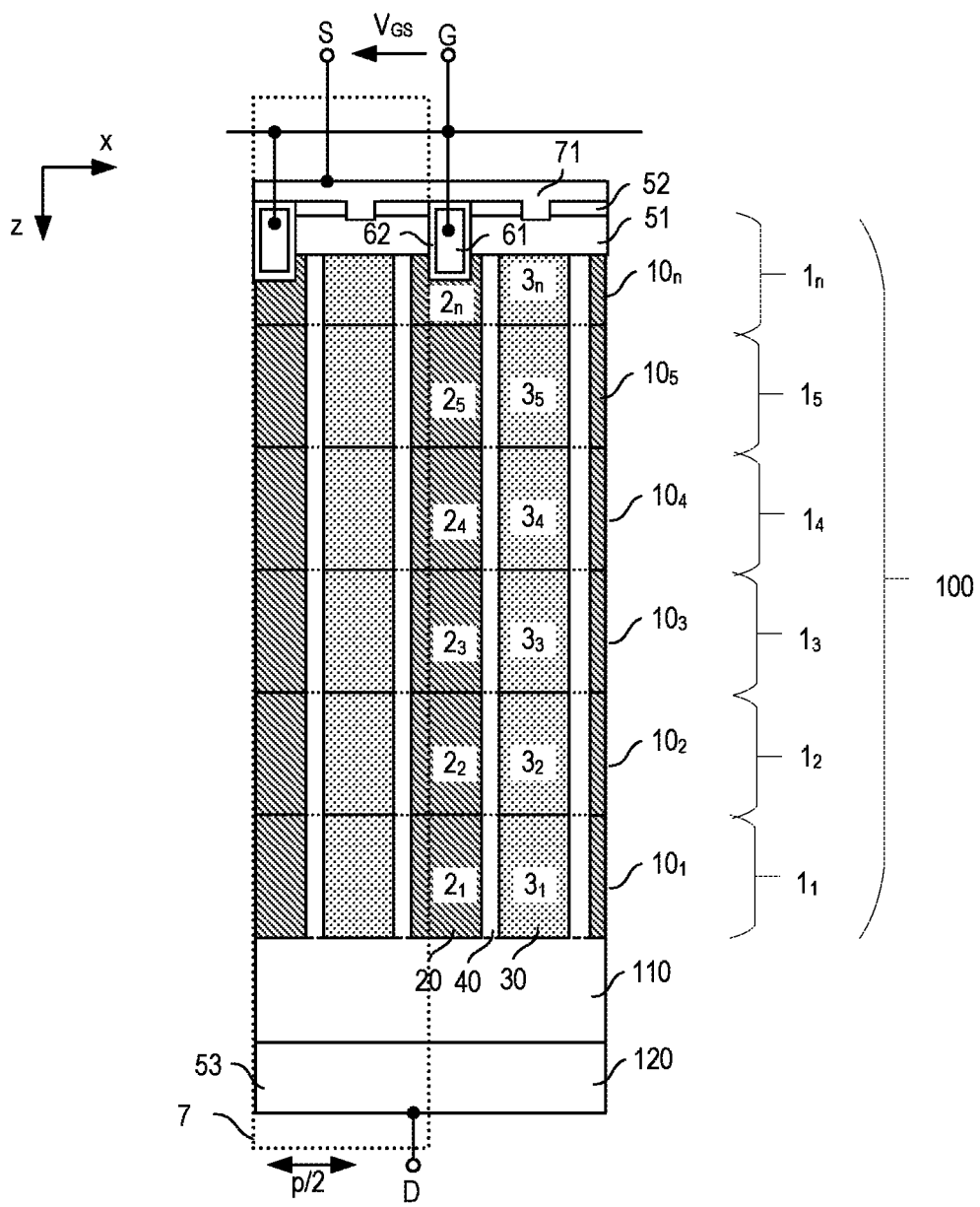
Figure 7A:
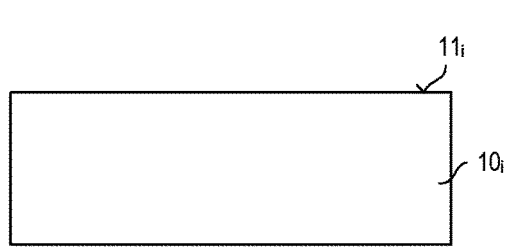
FIGS. 7A-7E show a modification of the method shown in FIGS. 1A-1F.
Figure 7B:
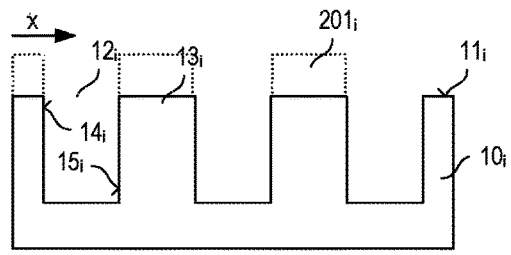
Figure 7C:
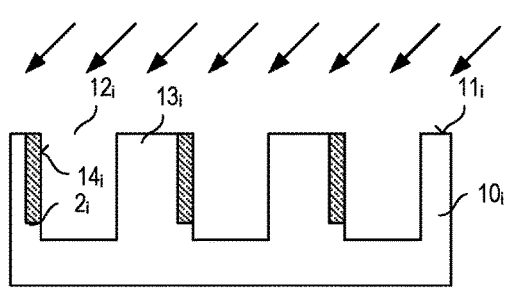
Figure 7D:
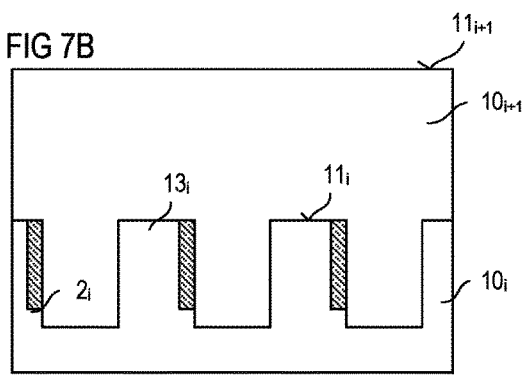
Figure 7E:
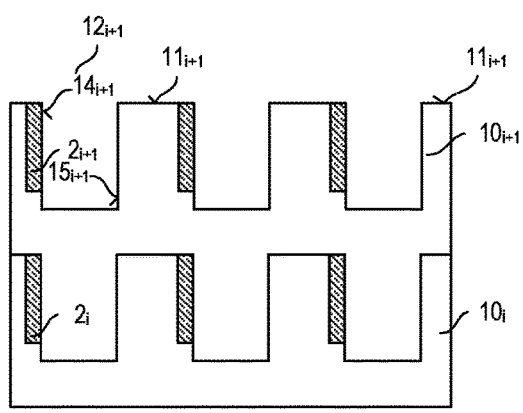

Based on the method explained with reference to FIGS. 1A-1F, a semiconductor structure with a plurality of semiconductor arrangements can be formed with each of these semiconductor arrangements including a plurality of first type regions $2_i$, $2_{i+1}$ and a plurality of second type doped regions $3_i$, $3_{i+1}$. Referring to the above, this semiconductor structure may form a drift region of a superjunction semiconductor device. FIG. 5A schematically illustrates a vertical cross-sectional view of a superjunction device that includes a drift region 100 with a plurality of n semiconductor arrangements $1_1$-$1_n$ formed one above the other. Just for the purpose of illustration, n=6 in this example. Referring to FIG. 5A, doped first type regions $2_1$-$2_n$ of the individual semiconductor arrangements $1_1$-$1_n$ are arranged one above the other in a vertical direction z and first type regions $2_1$-$2_n$ of adjoining semiconductor layers $10_1$-$10_n$ adjoin each other so that those first type regions $2_1$-$2_n$ that are arranged one above the other in the vertical direction z form a contiguous first type region 20. Equivalently, second type regions $3_1$-$3_n$ of the individual semiconductor arrangements $1_1$-$1_n$ form a contiguous second type region 30. The semiconductor arrangements $1_1$-$1_{i+1}$ explained with reference to FIG. 1F, represent any pair of adjacent semiconductor arrangements $1_1$-$1_n$ in the superjunction device shown in FIG. 5, that is, each of the semiconductor arrangements $1_1$-$1_n$ shown in FIG. 5A can be formed in accordance with the method shown in FIGS. 1A to 1F. Referring to FIG. 1F, first type regions $2_{i+1}$, $2_i$ in adjacent semiconductor arrangements $1_{i+1}$, $1_i$ can be produced to be spaced apart in the vertical direction z. Equivalently, second type regions $3_{i+1}$, $3_i$ semiconductor arrangements $1_i$, $1_{i+1}$ produced to be spaced apart in the vertical direction z. From the structure shown in FIG. 1F, a structure with adjoining first type regions $2_1$-$2_n$ and adjoining second type regions $3_1$-$3_n$ as shown in FIG. 5A can be obtained by an annealing process in which the implanted dopant atoms diffuse in the vertical direction z (and the lateral direction x) and are electrically activated (by being incorporated into substitutional sites of a crystal lattice of the semiconductor layers). According to one example, one common annealing process is performed to diffuse and activate the dopant atoms in each of the plurality of semiconductor arrangements formed one above the other. According to one example, a temperature in the annealing process that causes the dopant atoms to diffuse and to be activated is below 1300° C. and, in particular between 1100° C. and 1300° C. A duration of the annealing process may be between 30 minutes and 10 hours (600 minutes).

The drift region shown in FIG. 5A includes a lowermost semiconductor arrangement $1_1$. This lowermost semiconductor arrangement $1_1$—which may also be referred to as first semiconductor arrangement as it is the first semiconductor arrangement of the plurality of semiconductor arrangements that is formed—is formed on a substrate 120 or (as shown) on an optional epitaxial layer 110 formed on the substrate 120.

The superjunction device shown in FIG. 5A is implemented as a MOSFET. In this case, the substrate 120 forms a drain region 53 that is connected to a drain node D (which is only schematically illustrated in FIG. 5A) of the MOSFET. The MOSFET may include a plurality of device cells 7, whereas two of these device cells are shown in FIG. 5. Each of these device cells includes one first type region 20 and one second type region 30. The plurality of device cells share the drain region 120 and the epitaxial layer 110, whereas the epitaxial layer 110 is a part of the drift region of the superjunction MOSFET.

Each device cell (transistor cell) further includes a source region 52, a body region 51 separating the source region 52 from the drift region, and a gate electrode 61 dielectrically insulated from the body region 51 by a gate dielectric 62. The gate electrodes 61 of the individual device cells are electrically connected to a common gate node G, and the source and body regions 52, 51 of the individual device cells are electrically connected to a source node S via respective source electrodes 71. The second type region 30 of each device cells adjoins the body region 51, according to one example. The gate electrode 61 serves to control a conducting channel in the body region 51 between the source region 52 and the drift region, in particular the second type region 20 of the drift region.

The body regions 51 and the source regions 52 can be formed in the uppermost semiconductor arrangement $1_n$ by at least one of an implantation and a diffusion process. Before this at least one implantation and diffusion process, the trenches (corresponding to the trenches $12_{i+1}$ shown in FIG. 1F) of the uppermost semiconductor arrangement $1_n$ can be filled in accordance with the process explained with reference to FIG. 1E, that is, by epitaxially growing a semiconductor layer that fills the trenches $12_{i+1}$ and, optionally, planarizing this semiconductor layer. The source and body regions 51, 52 may then be formed using at least one of an implantation and diffusion process in this semiconductor layer. The epitaxial layer in which the source and drain regions 51, 52 are formed may be thinner in the vertical direction than the epitaxial layers explained before. According to one example, a thickness of this epitaxial layer is between 1 and 3 micrometers, in particular about 2 micrometers. The gate dielectric 62 includes an oxide, for example, and may be formed using an oxidation or deposition process. The gate electrode 61, for example, includes one of a metal and a highly doped polycrystalline semiconductor material such as polysilicon.

The superjunction MOSFET can be an n-type MOSFET or a p-type MOSFET. In an n-type MOSFET, the source region 52, the drain region 53 and the first type region 20 of the drift region 100 are n-type regions, and the body region 51 and the second type region 30 are p-type regions. In a p-type MOSFET the individual device regions have a doping type complementary to the doping type of the respective device regions in the n-type MOSFET.

The superjunction MOSFET can be operated in an on-state or an off-state. In the on-state, the gate electrode 61, driven by a drive voltage $V_{GS}$ applied between the gate node G and the source node S, generates a conducting channel in the body region 51 between the source region 52 and the first type region 20 so that upon applying a voltage between the drain node D and the source node S a current can flow between the drain node D and the source node S. In the off-state, the gate electrode 61 is driven such that the conducting channel in the body region 51 is interrupted. For the purpose of explanation, it is assumed that the MOSFET is in the off-state and a voltage is applied between the drain node D and the source node S that reverse biases a pn-junction between the body region 51 and the first type region 20 and a pn-junction between the first type region 20 and the second type region 30. In this case, space charge regions expand in the first type region 20, the body region 51 and also the second type region 30, whereas the first type regions 20 and the second type regions 30 may be completely depleted. According to one example, a doping concentration of the body region 51 is high enough for the body region 51 to not be depleted completely.

In the annealing process explained above, the first type regions $2_1$-$2_n$ and the second type regions $3_1$-$3_n$ may diffuse in the lateral direction x such that first type regions and second type regions adjoin each other. According to another example, shown in FIG. 5, regions having a basic doping of the respective semiconductor layers $10_1$-$10_n$ may remain between the first type regions $2_1$-$2_n$ and the second type regions $3_1$-$3_n$. The "basic doping" is a doping the semiconductor layers $1_1$-$1_n$ have before the first type regions $2_1$-$2_n$ and the second type regions $3_1$-$3_n$ are formed.

Figure 6:
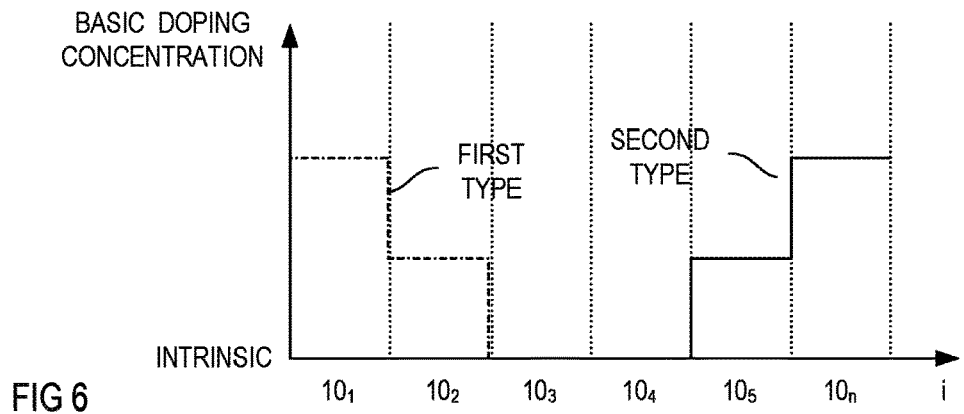
FIG. 6 shows one example of a basic doping of the individual semiconductor layers in the device shown in FIGS. 5A and 5B.

According to one example, the semiconductor layers $10_1$-$10_n$ are non-doped. As used herein, "non-doped" means that semiconductor layers $10_1$-$10_n$ have a basic doping of less than 8E13 cm$^{-3}$ or even less than 2E13 cm$^{-3}$ According to another example, shown in FIG. 6, at least some of the semiconductor layers $10_1$-$10_n$ are doped semiconductor layers, that is, have a basic doping of higher than 8E13 cm$^{-3}$, in particular higher than 1E14 cm$^{-3}$. In the example shown in FIG. 6, some of the semiconductor layers $10_1$-$10_n$ have a basic doping of the first doping type and others of the semiconductor layers $10_1$-$10_n$ have a basic doping of the second doping type. In this example, semiconductor layers in an upper half of the drift region 100 have a second type basic doping, and semiconductor layers in a lower half of the drift region 100 have a first type basic doping. The "upper half" is a section of the drift region adjoining the body regions 51, and the "lower half" is a section of the drift region 100 located towards the drain region 53.

One figure of merit of a superjunction MOSFET is the specific on-resistance $R_{DS\_ON} \cdot A$, which is the on-resistance $R_{DS\_ON}$ multiplied with the semiconductor area A consumed by the superjunction device in a plane perpendicular to the vertical direction z shown in FIG. 5. The specific on-resistance can be decreased by decreasing the pitch p, whereas the pitch p, as shown in FIG. 5, is given by a distance between same device structures, such as first type regions 20, in the lateral direction x. By the method explained with reference to FIGS. 1A-1F, a drift region with a relatively small pitch p can be produced because by virtue of implanting the dopant atoms into the sidewalls of the trenches the doped regions mainly extend in the vertical direction z (in the first lateral direction x, a dimension of the doped regions is significantly smaller than the trench width, as shown in FIG. 1D) and there is no need to diffuse the introduced dopant atoms deep into the respective semiconductor layer in order to form contiguous first type and second type regions 20, 30. Furthermore, the implantation process allows to exactly control the amount of first type dopant atoms and second type dopant atoms introduced into the respective semiconductor layer $10_i$, $10_{i+1}$. By this the overall amount of first type dopant atoms and second type dopants in each horizontal plane of the drift region can be exactly controlled. The "horizontal plane" is a plane perpendicular to the section plane shown in FIG. 5A.

In the semiconductor device shown in FIG. 5A, the gate electrode 61 of each device cell is a planar electrode that is arranged above a surface of the layer arrangement 100. This, however, is only an example. According to another example, shown in FIG. 5B, the gate electrode of each device cell is a trench electrode. That is, the gate electrode 61 is arranged in a trench above the first type region 20 and adjacent the body region 51 and the source region 52, and the gate electrode 61 is dielectrically insulated from these regions by the gate dielectric 62. Everything else that is described above with reference to the device shown in FIG. 5A applies to the device shown in FIG. 5B as well.

FIGS. 7A-7E show a modification of the method shown in FIGS. 1A-1F. In the method shown in FIGS. 7A-7E only dopant atoms of the first type are implanted into the trenches $12_i$, $12_{i+1}$ of the respective semiconductor layer $10_i$, $10_{i+1}$. That is, the process of implanting second type dopant atoms into any of the sidewalls of the trenches $12_i$, $12_{i+1}$ is omitted. In the method shown in FIGS. 7A-7E, the first type dopant atoms are implanted into the first sidewalls $14_i$, $14_{i+1}$ only. This, however, is only an example. According to another example (not shown), first type dopant atoms are implanted into the first sidewalls $14_i 14_{i+1}$ and the second sidewalls $15_i$, $15_{i+1}$ in the trenches $12_i$, $12_{i+1}$ of the respective semiconductor layers $10_i$, $10_{i+1}$. Forming a drift region of a superjunction device based on the method shown in FIGS. 74-7E includes forming the semiconductor layers $10_i$, $10_{i+1}$ with a basic doping of the second type, as those sections that keep the basic doping form the second type regions in the finished device.

Figure 8A:
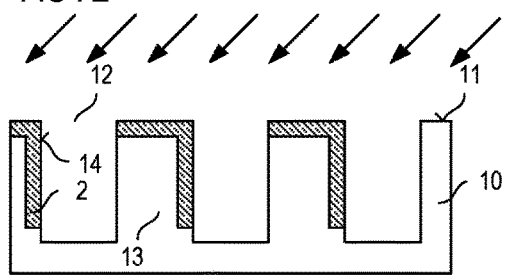
FIGS. 8A-8B shows one example of the process shown in FIGS. 1C and 1D in greater detail.

The method explained with reference to FIGS. 1A-1F includes implanting first type dopant atoms into first sidewalls 14 and implanting second type dopant atoms into second sidewalls 15 of the respective trenches. According to one example, shown in FIGS. 8A and 8B, implanting the first type dopant atoms into the first sidewall 14 of each trench 12 and implanting the second type dopant atoms into the second sidewall 15 of each trench not only includes implanting the respective dopant atoms into the respective sidewall, but also includes implanting first type dopant atoms and second type dopant atoms into the mesa regions 13 along the first surface 11. As a result, after the two implantation processes, there are doped regions 23 along the first surface 11 that includes first type dopant atoms and second type dopant atoms. If, according to one example, the amount of first type dopant atoms and the amount of second type dopant atoms in these doped regions 23 is balanced (the amount of first type dopant atoms equals the amount of second type dopant atoms) the effective doping concentration in this region 23 is substantially zero (intrinsic), so that these regions 23 do not affect operation of the finished superjunction device.

Figure 8B:
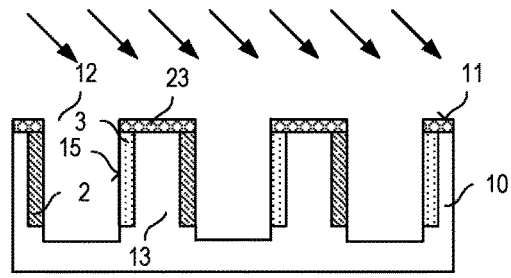
Figure 9:
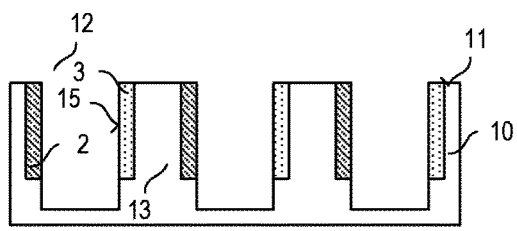
FIG. 9 shows the structure shown in FIG. 8B after an etching process.

Referring to FIG. 9, which illustrates the semiconductor layer 10 shown in FIG. 8B after a further processing, these regions 23 including first type dopant atoms and second type dopant atoms may be removed in an etching process. This etching process may also etch the bottom 16 of the trenches 12, to extend the trenches 12 slightly deeper into the respective semiconductor layer 10. According to one example, the etching process includes a wet etching process using an alkaline etchant, such as one of the etchants explained above. If, for example, the semiconductor layer 10 is such that the first surface 11 is in the {110} plane and that each of the first and second surface 14, 15 is in the {111} plane, an alkaline wet etchant mainly etches the first surface 11 on the mesa regions 13 and the bottom 16 at a much higher etch rate than the first and second sidewalls 14, 15 so that the sidewalls 14, 15 are not significantly etched in this process. According to another example, the etching process includes an anisotropic dry etch process.

Figures 10A, 10B:
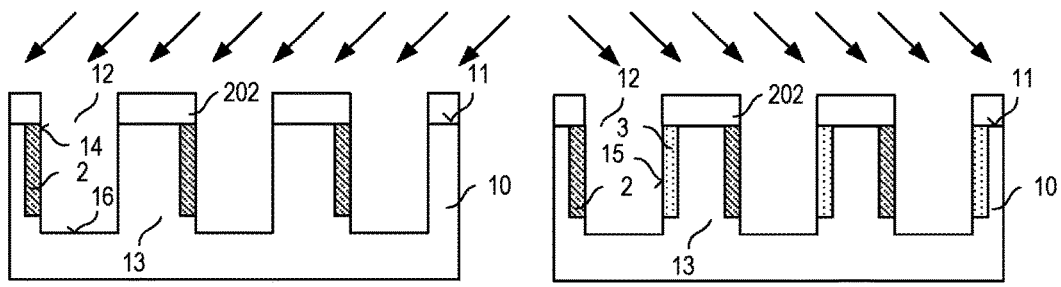
FIGS. 10A-10B show another example of the process shown in FIGS. 1C and 1D in greater detail.

According to another example shown in FIGS. 10A and 10B, an implantation mask 202 is formed on the first surface 11 on the mesa regions 13 to prevent first type dopant atoms and second type dopant atoms from being implanted into the first surface 11 of the mesa region. This implantation mask 202 is removed before forming another semiconductor layer (not shown in FIGS. 10A and 10B) on top of semiconductor layer 10. According to one example, the implantation mask 202 is the etch mask (201$_i$ in FIG. 1B) used to etch the trenches 12 in the semiconductor layer 10. In this example, the etch mask stays in place until after the implantation process.

Figure 11A:
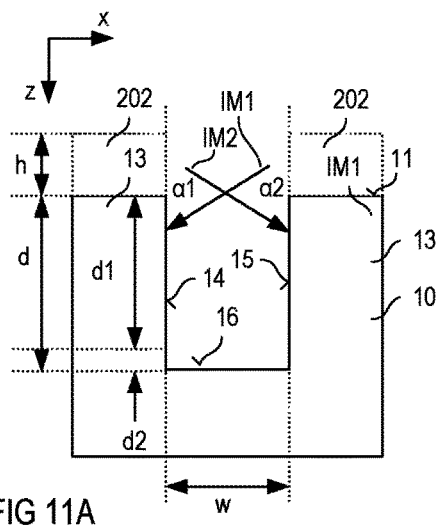
FIGS. 11A-11B illustrate in greater detail implanting dopant atoms into sidewalls of the trenches to form the implanted regions.
Figure 11B:
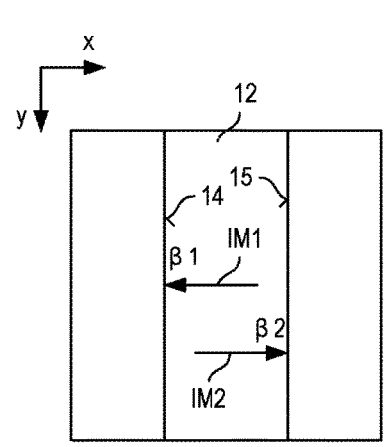

According to one example, implanting the dopant atoms into the at least one of the first sidewall 14 and the second sidewall 15 of the plurality of trenches includes implanting the at least one dopant atoms such that they are implanted into the respective sidewall but not the bottom 16 of the respective trench 12. This is explained in greater detail with reference to FIGS. 11A and 11B. These Figures show a vertical cross-sectional view of one trench 12 in one semiconductor layer 10 (FIG. 11A) and a top view of the trench 12 (FIG. 11B). In FIGS. 11A and 11B, reference character 10 denotes any of the semiconductor layers explained before, reference character 12 denotes any of the trenches in this semiconductor layer 10, and reference characters 14, 15 and 16 denote the first sidewall, the second sidewall and the bottom of the trench 12, respectively. Furthermore, reference character 202 denotes the optional implantation mask on top of the semiconductor layer 10 during the implantation process. The arrows IM1 and IM2 shown in FIGS. 11A and 11B illustrate directions in which dopant atoms are implanted into the first sidewall 14 and the second sidewall 15, respectively. These directions are referred to as implantation directions in the following. These implantation directions IM1, IM2 are inclined relative to the vertical direction z, which is the direction perpendicular to the first surface 11 of the semiconductor layer 10. Angles between the vertical direction z and the implantation directions IM1, IM2 are referred to as implantation angles in the following. A first implantation angle $\alpha 1$ is the angle between the vertical direction z and the first implantation direction IM1 and a second implantation angle $\alpha 2$ is the angle between the vertical direction z and the second implantation direction IM2. According to one example, the first and second implantation angles are complementary, that is, magnitudes of the first and second implantation angles $\alpha 1$ and $\alpha 2$ are equal and the first and second implantation angles $\alpha 1$ and $\alpha 2$ have different signs, that is, $$|\alpha 1|=|\alpha 2| \qquad (1a),$$

$$\alpha 2=-\alpha 1 \qquad (1b).$$

According to one example, the implantation angles $\alpha 1$ and $\alpha 2$ are adjusted such that dopant atoms are implanted into the sidewalls 14, 15, but not into the bottom 16 of the trench 12. If the implantation mask 202 is omitted, implanting dopant atoms into the bottom 16 can be avoided by adjusting the first and second implantation angles $\alpha 1$, $\alpha 2$ such that $$|\alpha 1|>\arctan(w/d) \qquad (2a)$$

$$|\alpha 2|>\arctan(w/d) \qquad (2b).$$

If there is an implantation mask, implanting dopant atoms into the bottom 16 of the trench 12 can be avoided by adjusting the implantation angles $\alpha 1$, $\alpha 2$ such that $$|\alpha 1|>\arctan(d+h)) \qquad (3a)$$

$$|\alpha 2|>\arctan(w/(d+h)) \qquad (3b),$$

where d is the depths of the trench 12, w is the width of the trench 12, and h is a thickness of the implantation mask 202. According to one example, the first and second implantation angles $\alpha 1$, $\alpha 2$ are adjusted such that there are sidewall sections of at least one of the first sidewall 14 and the second sidewall 15 into which dopant atoms are not directly implanted, that is, which are shielded by the mesa regions 13 during the implantation process. In FIG. 11A, d1 denotes a dimension of those sidewall sections into which dopant atoms are implanted, and d2 denotes a dimension of those sidewall sections into which dopant atoms are not implanted. To implant dopant atoms into the upper sidewall sections having the dimension d1 only, the first and second implantation angles $\alpha 1$, $\alpha 2$ are given as follows:

$$|\alpha 1|=\arctan(w/d1) \qquad (4a)$$

$$|\alpha 2|=\arctan(w/d1) \qquad (4b).$$

When adjusting the first and second implantation angles $\alpha 1$, $\alpha 2$ in accordance with equations (4a) and (4b), variations of the trench depths up to d2 can be tolerated without running the risk of dopant atoms being implanted into the bottom 16. Thus, d2 can be considered as safety margin in the implantation process.

According to one example, each of the first type dopant atoms and the second type dopant atoms are implanted in one respective implantation process that uses one respective implantation angle. That is, the first type dopant atoms may be implanted in a first implantation process using a first implantation angle, such as angle $\alpha 1$ explained above, and the second type dopant atoms may be implanted in a second implantation process using a second implantation angle, such as angle $\alpha 2$ explained above. In this type of process, a dose of implanted dopant atoms is substantially equal in each section of the first and second sidewall 14, 15 into which dopant atoms are implanted.

According to another example, at least one of the first type dopant atoms and the second type dopant atoms are implanted in two or more (at least two) implantation processes using different implantation angles to achieve a varying dopant dose along the respective sidewall. According to one example, the first type dopant atoms are implanted into the first sidewall 14 in at least two implantation processes, a first process using implantation angle $\alpha 11$ and a second process using implantation angle $\alpha 12$, where $\alpha 11>\alpha 12$. These implantation angles $\alpha 11$, $\alpha 12$ may each be chosen such that the first type dopant atoms are implanted into the first sidewall 14, but not the bottom 16. By virtue of the implantation angles $\alpha 11$, $\alpha 12$ being different there is a first sidewall section of the first sidewall 14 into which dopant atoms are implanted in both implantation processes and an adjoining second sidewall section into which dopant atoms are implanted only in the implantation process using the smaller implantation angle $\alpha 12$. Thus, in the first sidewall section, which begins at the surface 11 there is a higher dopant dose than in the second sidewall section that is spaced apart from the surface. By using more than two implantation processes with mutually different implantation angles more than two sidewall sections with different dopant doses are obtained.

Alternatively or additionally, the second type dopant atoms are implanted into the second sidewall 15 in at least two implantation processes, a first process using implantation angle β11 and a second process using implantation angle β12, where β11>β12, to obtain at least two sidewall sections of the second sidewall 15 with different dopant doses. These implantation angles β11, β12 may each be chosen such that the first type dopant atoms are implanted into the second sidewall 15, but not the bottom 16. If two or more implantation processes are used when implanting the first dopant atoms into the first sidewall 14 and when implanting the second type dopant atoms into the second sidewall 15 the individual implantation angles may be chosen such in each case two implantation angles are complementary so that, for example, α11=−β11, α12=−β12, etc.

How far a sidewall section of the first and second sidewall 14, 15 into which dopant atoms are implanted in one implantation process extends towards the bottom 16 is dependent on the implantation angle, wherein an area of the sidewall section and, therefore, its extension towards the bottom 16 increases as the implantation angle decreases. According to one example, the implantation processes that implant the first type dopant atoms and the second type dopant atoms are selected such that one of the first type dopant atoms and the second type dopants are implanted into deeper sidewall sections than the other one of the first and second dopant atoms. This can be obtained by suitably selecting the implantation angles. The first type dopant atoms, for example, can be implanted into deeper sidewall sections than the second type dopant atoms by choosing the first implantation angle α1 such that its magnitude |α1| is smaller than the magnitude of the second implantation angle |β1| or, if there are two or more implantation processes, by choosing the smallest implantation angle (α12 in the example above) such that its magnitude is smaller than the smallest implantation angle (β12 in the example above) in the process of implanting the second type dopant atoms.

The first type dopant atoms and the second type dopant atoms may have different diffusion coefficients. In this example, the dopant atoms that diffuse faster are implanted less deep than the dopant atoms that diffuse slower. Boron (B), for example, which is a p-type dopant diffuses faster than arsenic (As) or antimony (Sb), which are n-type dopant. If, for example, the first type dopant atoms include boron (B) and the second type dopant atoms include one of arsenic (As) and antimony (Sb) the second type dopant atoms may be implanted in deeper sidewall sections than the first type dopant atoms. According to one example, this type of implantation process in which different implantation angles are used to implant faster diffusing dopant atoms into less deep sidewall sections than slower diffusing dopant atoms may be used in each of the plurality of semiconductor arrangements. According to another example, this type of implantation process is used at least in forming the lowermost semiconductor arrangement, which is the semiconductor arrangement (labelled with 10₁ in FIGS. 5A and 5B) that adjoins the substrate 120 or the epitaxial layer 110.

FIG. 11A shows the implantation directions IM1, IM2 in a vertical section plane of the semiconductor layer 10, that is, in a section plane perpendicular to the first surface 11. FIG. 11B shows the implantation directions IM1, IM2 in a horizontal plane, which is a plane parallel to the first surface 11. In FIG. 11B, β1 and β2 denote angles between the implantation directions IM1, IM2 and a longitudinal direction of the trench 12. The "longitudinal direction" of the trench 12 is the direction of the trench in the second lateral direction y explained before. According to one example, each of β1 and β2 is substantially 90° that is, in the first and second implantation directions IM1, IM2 are substantially perpendicular to edges of the trench 12. "Edges" of the trench 12 are edges between the surface 11 and the first and second sidewalls 14, 15. According to one example, if the first surface 11 is in the {110} plane and each of the first and second sidewall 14, 15 is in the {111} plane the edge runs in a <112> direction of the crystal lattice of the semiconductor layer 10.

FIGS. 12A-12D illustrate another example of how implanting dopant atoms into the bottom 16 of the trenches 12 can be prevented. FIGS. 12A-12D each show a vertical cross-sectional view of a semiconductor layer 10 during different process sequences. The semiconductor layer 10 shown in FIGS. 12A-12D represent any of the semiconductor layers explained herein before.

Figure 12A:
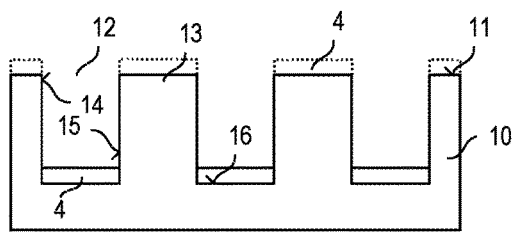

Referring to FIG. 12A, the method includes forming a protection layer 4 on the bottom 16 of the trenches 12 before implanting dopant atoms into the sidewalls. According to one example, the protection layer includes an oxide, such as silicon oxide. Such protection layer 4 may be formed using a HDP (High Density Plasma) process in which the protection layer 4 is deposited. According to one example, the protection layer is only formed on the bottom 16 of the trenches 12. According to another example (illustrated in dotted lines) the protection layer 4 is not only formed on the bottom 16 of the trenches 12 but also on top of the mesa regions 13.

Figure 12B:
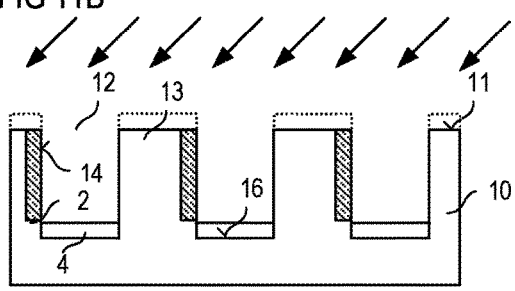

FIG. 12B illustrates implanting first type dopant atoms into the first sidewall 14 of each of the trenches 12. In this implantation process, the implantation angle may be chosen such that dopant atoms are not only implanted into the first sidewall 14, but also the protection layer 4. The protection layer, however, prevents dopant atoms from reaching the semiconductor layer 10 below the bottom 16.

FIG. 12C illustrates implanting dopant atoms of the second type into the second sidewall 15 of each of the plurality of trenches 12. In this implantation process, the implantation angle can be chosen such that dopant atoms are not only implanted into the second sidewall 15, but may also be implanted into the protection layer 4. The protection layer 4, however, prevents dopant atoms from reaching the semiconductor layer 10 below the bottom 16.

Referring to FIG. 12D, the method further includes removing the protection layer 4 from each of the trenches 12. By removing the protection layer 4, dopant atoms that have been implanted into the protection layer are also removed, so that these dopant atoms do not affect the functionality of the finished supeduction semiconductor device.

Although FIGS. 12B and 12C illustrate implanting first type dopant atoms into the first sidewall 14 and implanting second type dopant atoms into the second sidewall 15, using the protection layer 4 is not restricted to this specific process. Instead, the protection layer 4 can be used in any process in which at least one of the first type dopant atoms and the second type dopant atoms are implanted into at least one of the first sidewall 14 and the second sidewall 15 of the trenches 12.

Figure 13D:
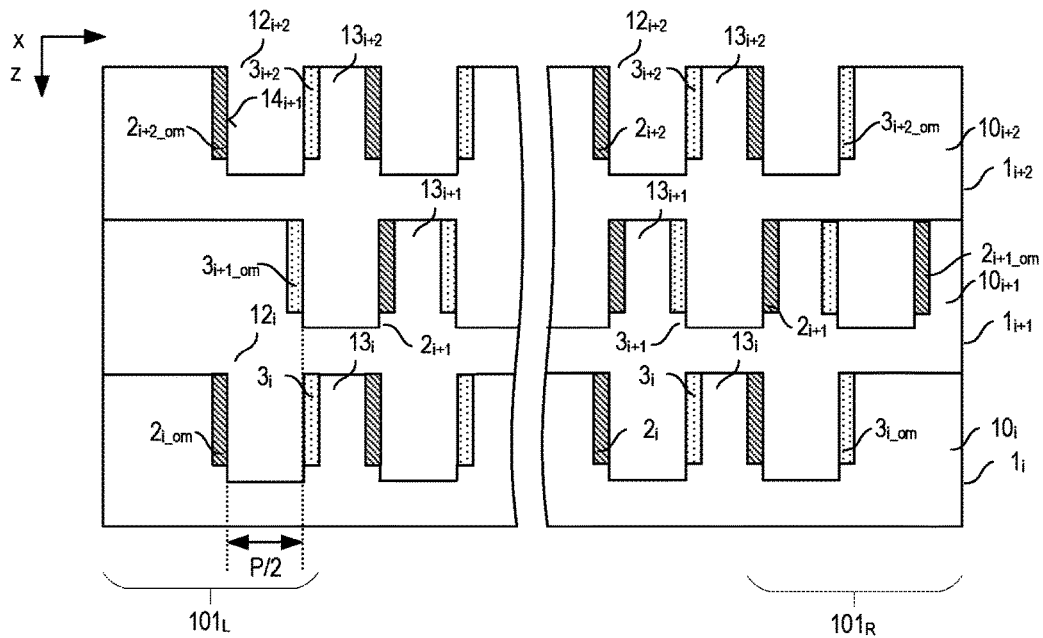

FIGS. 13A-13D illustrate another modification of the method explained with reference to FIGS. 1A-1F. FIG. 13A shows two different sections of the bottom semiconductor layer 10ᵢ after the process steps explained with reference to FIGS. 1A-1D, that is, after forming the plurality of trenches $12_i$ and implanting first type dopant atoms into the first sidewall $14_i$ of each trench $12_i$ and implanting second type dopant atoms into the second sidewall $15_i$ of each trench $12_i$.

FIG. 13B shows the semiconductor structure after forming the top semiconductor layer $10_{i+1}$ in the trenches $12_i$ and on the mesa regions $13_i$ of the bottom semiconductor layer $10_i$, and after forming the plurality of trenches $12_{i+1}$ in the top semiconductor layer $10_{i+1}$. In the example shown in FIG. 13B, the trenches $12_{i+1}$ in the top semiconductor layer $10_{i+1}$ are offset in the first lateral direction x relative to the trenches $12_i$ (that have been filled by the top semiconductor layer $10_{i+1}$ in the structure shown in FIG. 13B) of the bottom semiconductor layer $10_i$. The offset is, for example, the distance in the lateral direction x between equivalent features in the bottom semiconductor layer $10_i$ and the top semiconductor layer $10_{i+1}$. The offset that is labelled with o in FIG. 13B is, for example, the shortest distance in the first lateral direction x between the first sidewall $14_i$ of the individual trenches in the bottom semiconductor layer $10_i$ and the first sidewalls $14_{i+1}$ of the trenches $12_{i+1}$ in the top semiconductor layer $10_{i+1}$. According to one example, the offset is about 50% of the pitch p, that is, o≈p/2.

Referring to FIG. 13C, the method further includes implanting first type dopants into the second sidewall $15_{i+1}$ of each of the plurality trenches $12_{i+1}$ in the top semiconductor layer $10_i$ and implanting second type dopant atoms into the first sidewall $14_{i+1}$ of each of the plurality of trenches $12_{i+1}$ of the top semiconductor layer $10_{i+1}$. By virtue of the offset o, the trenches $12_{i+1}$ in the top semiconductor layer $10_{i+1}$ are substantially above the mesa regions $13_i$ of the bottom semiconductor layer $10_i$. By virtue of forming the second type semiconductor layers $3_{i+1}$ along the first sidewall $14_{i+1}$ and the first type semiconductor layer $2_{i+1}$ along the second sidewall $15_{i+1}$, the first type region $2_{i+1}$ is substantially above the first type region $2_i$ in the mesa region $13_i$ below the trench $12_{i+1}$, and the second type region $3_{i+1}$ is substantially above the second type region $3_i$ in the mesa region $13_i$ below the trench $12_{i+1}$.

FIG. 13D shows the semiconductor structure shown in FIG. 13C after forming another semiconductor arrangement $1_{i+2}$ on top of the semiconductor arrangement $1_{i+1}$. In this semiconductor structure, the semiconductor arrangement $1_{i+1}$ and the semiconductor arrangement $1_{i+2}$ form another pair of semiconductor arrangements, with the semiconductor arrangement $1_{i+1}$ being the bottom semiconductor arrangement and the semiconductor arrangement $1_{i+2}$ being the top semiconductor arrangement in this pair. Referring to FIG. 13D, the top semiconductor arrangement $1_{i+2}$ is formed such that the plurality of trenches $12_{i+2}$ of the top semiconductor arrangement $10_{i+2}$ are offset in the first lateral direction x relative to the trenches $12_{i+1}$ (which have been filled by the semiconductor layer $10_{i+2}$ of the top arrangement $1_{i+2}$) of the bottom semiconductor arrangement $1_{i+1}$. According to one example, the offset is such that the trenches $12_{i+2}$ in the semiconductor layer $10_{i+2}$ are substantially aligned with the trenches $12_i$ in the semiconductor arrangement $1_i$ spaced from the semiconductor arrangement $1_{i+2}$ by the semiconductor arrangement $1_{i+1}$. In the top semiconductor arrangement $10_{1+2}$, first type regions $2_{i+2}$ are formed along first sidewalls $14_{i+1}$, and second type regions $3_{i+2}$ are formed along second sidewalls $15_{i+2}$.

It should be noted that in the context of the present explanation, first sidewalls 14 are left sidewalls and second sidewalls 15 are right sidewalls of the respective trenches. This, however, is only an example. According to another example, first sidewalls are right sidewalls and second sidewalk are left sidewalls of the respective trenches.

In the method illustrated in FIGS. 13A to 13C, each of the first type dopants and the second type dopants is alternately implanted into first and second sidewalls. That is, for example, first type dopants are implanted into the first sidewalls $14_i$, $14_{i+2}$ using implantation angle α1 in layers $10_i$, $10_{i+2}$ and into the second sidewalls $15_{i+1}$ using implantation angle α2 in layer $10_{i+1}$. Equivalently, second type dopants are implanted into the second sidewalls $15_i$, $15_{i+2}$ using implantation angle α2 in layers $10_i$, $10_{i+2}$ and into the first sidewalls $14_{i+1}$ using implantation angle α1 in layer $10_{i+1}$. As explained above, α1=−α2.

The method explained with reference to FIGS. 13A-13D offers several benefits. First, a substantially planar surface 11 of the individual semiconductor layers 10 can be obtained even if several semiconductor layers are formed one above the other. Referring to the explanation above, forming the individual semiconductor layers 10 includes epitaxially growing a top semiconductor layer $10_{i+1}$ in the trenches $12_i$ and on the mesa regions $13_i$ of a bottom semiconductor layer $10_i$ formed before. This process may result in slight recesses (not shown) in the epitaxially grown top semiconductor layer $10_{i+1}$ in those regions that are located above the trenches $12_i$ of the bottom semiconductor layer $10_i$. In the method explained with reference to FIGS. 13A to 13D a position of those recesses alternates so that a more planar surface of the respective epitaxial layers is obtained.

Furthermore, trenches 12 may formed such that they extend down into the implanted regions 2, 3 in the epitaxial layer formed before (this is explained below). In this case forming the trenches may result in partly removing the implanted regions formed before. If the trenches 12 in a top layer are not formed in exactly the desired lateral position, that is exactly above the trenches in the bottom layer, the situation may arise that implanted regions of one type are removed to a greater extent than implanted regions of the other type. This may finally result in the amount of first and second type dopant atoms (resulting from the implantation) in one or more epitaxial layers not being balanced. The method explained with reference to FIGS. 13A to 13D may reduce or even eliminate this effect.

Second, in edge regions of the semiconductor structure, outermost first type regions 2 and outermost second type regions 3 are arranged alternately in the vertical direction z. "Outermost implanted regions" are the outermost regions in the first lateral direction x in each epitaxial layer. These outermost regions are identified by an additional subscript index "om" in FIG. 13D. This can be seen from FIG. 13D, where reference character $101_L$ denotes a left edge region and $101_R$ denotes a right edge region of the semiconductor structure. An "edge region" is a region where the structure with the trenches and the first and second type semiconductor regions terminates. According to one example, the same number of trenches is formed in each epitaxial layer $10_i$, $10_{i+1}$, $10_{i+2}$ so that in each epitaxial layer the same number of first type implanted regions 2 and second type implanted regions is formed. Spaced apart from the edge region, in each epitaxial layer each first type implanted region 2 has a counterpart second type implanted region 3 in the respective epitaxial layer. The counterpart second type implanted region 3 is in the same mesa region 13 as the corresponding first type implanted region 2. In the edge regions $101_L$, $101_R$, the outermost first type implanted regions 2 and second type 3 implanted regions have no such counterpart implanted regions in the same epitaxial layer. The counterpart implanted regions to outermost implanted regions in one epitaxial layer are outermost implanted regions in an epitaxial layer adjoining the one epitaxial layer.

Figures 14A, 14B:
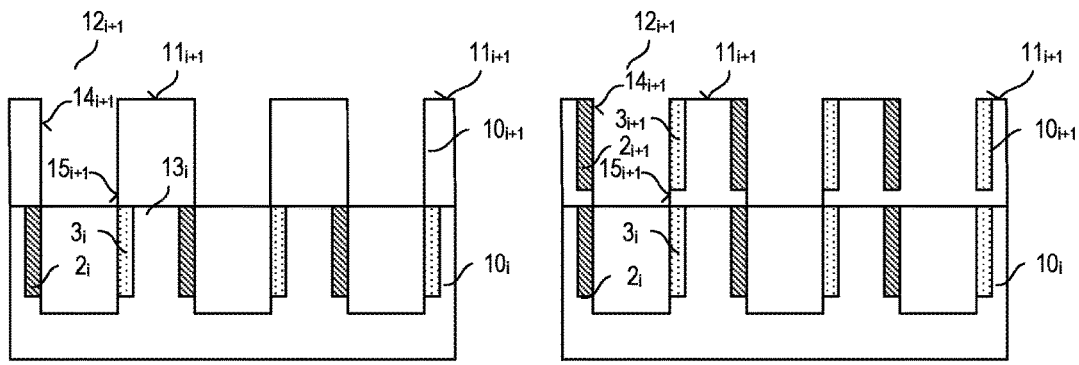
FIGS. 14A-14B shows a modification of the method shown in FIGS. 1A-1F.
Figures 15A, 15B:
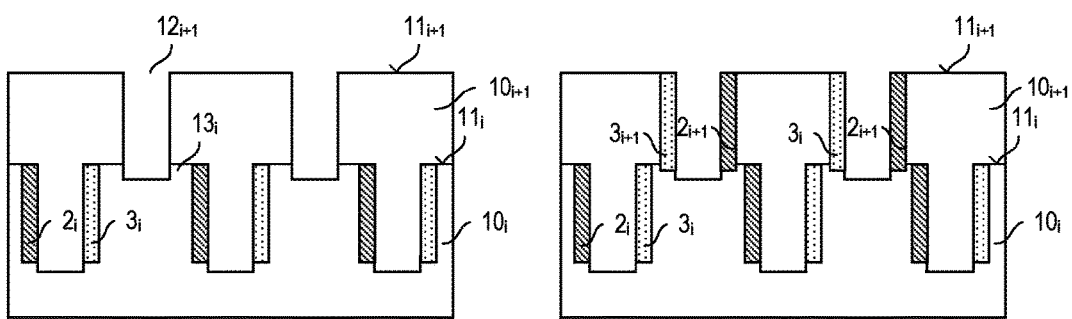
FIGS. 15A-15B shows another modification of the method shown in FIGS. 1A-1F.

FIGS. 14A and 14B show another modification of the method shown in FIGS. 1A-1F. In the method shown in FIG. 14A, the trenches $12_{i+1}$ in the top semiconductor layer $10_{i+1}$ are etched down to the mesa regions $13_i$ of the bottom semiconductor layer $10_i$. According to yet another example, shown in FIGS. 15A and 15B, the trenches $12_{i+1}$ in the top semiconductor layer $10_{i+1}$ are offset relative to the trenches in the bottom semiconductor layer $10_i$ in the first lateral direction x, and these trenches $12_{i+1}$ are etched into the mesa regions $13_i$ of the bottom semiconductor layer $10_i$. That is, a depth of these trenches $12_{i+1}$ is larger than a thickness of the epitaxially grown top semiconductor layer $10_{i+1}$. FIGS. 14A and 15A show the semiconductor structure after forming the respective trenches $12_{i+1}$ and FIGS. 14B and 15B show the semiconductor structure after forming the first type semiconductor regions $2_{i+1}$ and the second type semiconductor regions $3_{i+1}$, along sidewalls of the trenches $12_{i+1}$.

Figure 16A:
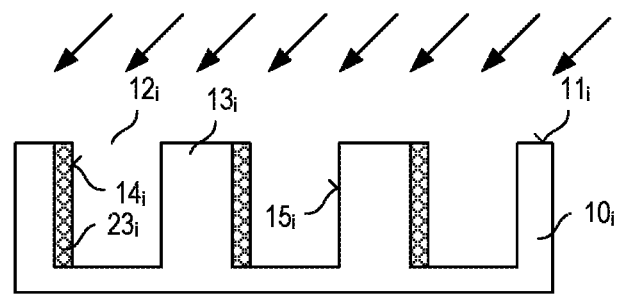
FIGS. 16A-16C shows a method that includes introducing dopant atoms of both a first type and a second type into one sidewall.
Figure 16B:
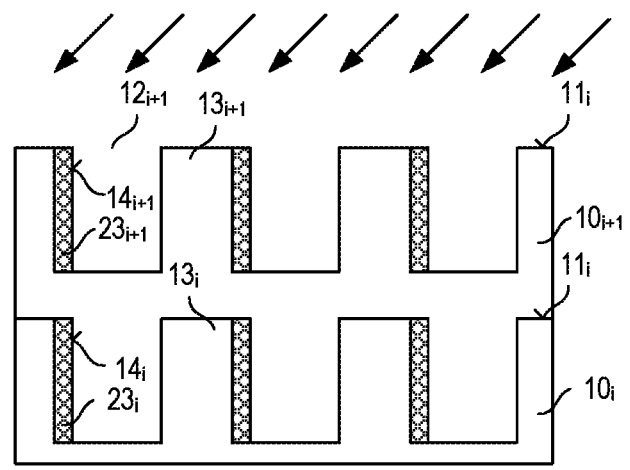
Figure 16C:
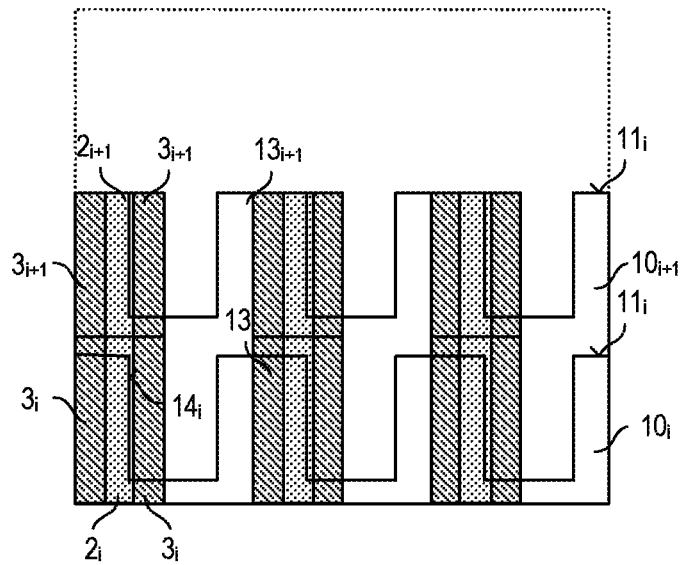

FIGS. 16A-16C illustrate another modification of the method shown in FIGS. 1A-1F. Referring to FIG. 16A, this method includes implanting both first type dopant atoms and second type dopant atoms into at least one of the first sidewall $14_i$ and the second sidewall $15_i$ of the bottom semiconductor layer $10_i$. Just for the purpose of illustration, the first type dopant atoms and the second type dopant atoms are implanted into the first sidewall $14_i$ in the example shown in FIG. 16A.

Referring to FIG. 16B, the method further includes forming the top semiconductor layer $10_{i+1}$ on top of the bottom semiconductor layer $10_i$, and forming the plurality of trenches $12_{i+1}$ in the top semiconductor layer $10_{i+1}$. According to one example, the trenches $12_{i+1}$ in the top semiconductor layer $10_{i+1}$ are substantially aligned with the trenches $12_i$ in the bottom semiconductor layer $10_i$.

The method may further include forming one or more semiconductor arrangements on top of the top semiconductor arrangement $10_{i+1}$ shown in FIG. 16B. These optional further semiconductor arrangements are schematically illustrated by a dotted line in FIG. 16C. Referring to FIG. 16C, the method further includes annealing the semiconductor structure to diffuse the first type dopant atoms and the second type dopant atoms in the semiconductor structure. The first type dopant atoms and the second type dopant atoms are selected such that they have different diffusion coefficients, so that the annealing process, based on the implanted regions $23_i$, $23_{i+1}$ results in adjoining first type semiconductor regions $2_i$, $2_{i+1}$ and second type semiconductor regions $3_i$, $3_{i+1}$. According to one example, the diffusion constant of one of the first type dopant atoms and the second type dopant atoms is at least 1.5 times or at least 2 times the diffusion constant of the other one of the first type dopant atoms and the second type dopant atoms. Pairs of dopant atoms that have different diffusion constants are boron (B) and arsenic (As), or boron (B) and antimony (Sb), for example. Boron is a p-type dopant, arsenic and antimony are n-type dopants. In each of these pairs, boron is the dopant with the higher diffusion coefficient. A ratio of the respective diffusion coefficients of boron and arsenic, for example, is 4:1. That is, boron diffuses four times as fast as arsenic.

According to one example, a temperature in the annealing process that causes the dopant atoms to diffuse is below 1300° C. and, in particular between 1100° C. and 1300° C. A duration of the annealing process may be between 30 minutes and 10 hours (600 minutes). According to one example, the annealing process takes place in an oxidizing ambience, that is, in an oxygen containing ambience. According to one example, the ambience additionally includes water vapor.

According to one example, the method includes one annealing process after manufacturing the complete layer arrangement, that is, after each of the plurality of epitaxial layers has been formed to diffuse the dopant atoms in each of the plurality of semiconductor layers.

Figure 17A:
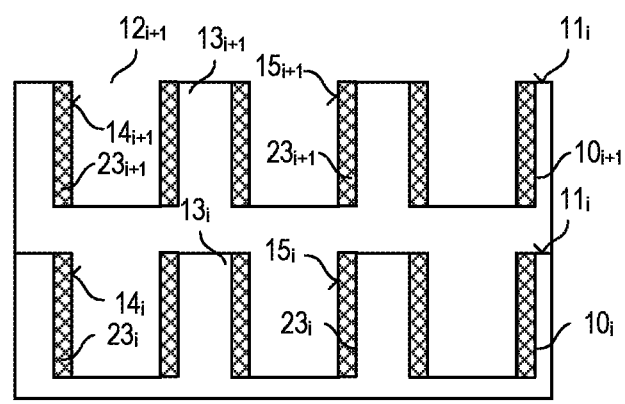
FIGS. 17A-17B shows a method that is based on the method shown in FIGS. 16A-16C and that includes introducing dopant atoms of both types into each sidewall.
Figure 17B:
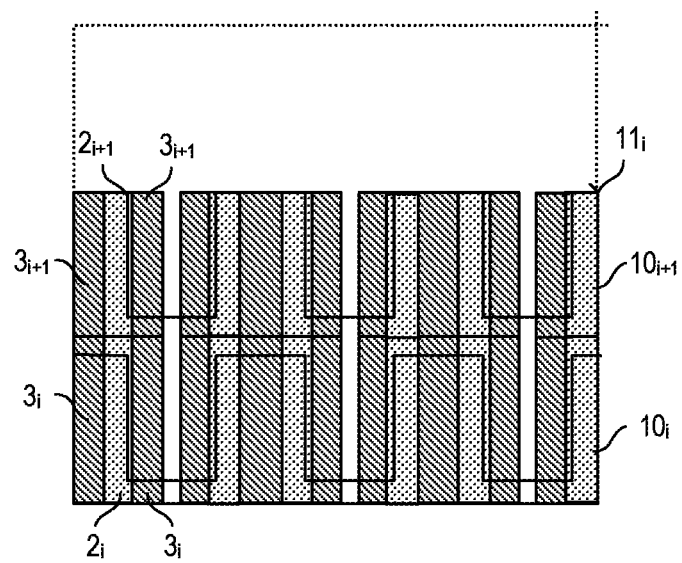

FIGS. 17A-17B illustrate a method that is based on the method shown in FIGS. 16A-16C and includes implanting both first type dopant atoms and second type dopant atoms into both the first sidewall 14 and the second sidewall 15 before the annealing process. FIG. 17A shows a vertical cross-sectional view of two adjacent semiconductor layers $10_i$, $10_{i+1}$ after forming doped regions $23_i$, $23_{i+1}$ along first sidewalls $14_i$, $14_{i+1}$ and second sidewalls $15_i$, $15_{i+1}$ of trenches formed in these semiconductor layers $10_i$, $10_{i+1}$. Each of these implanted regions $23_i$, $23_{i+1}$ includes first type dopant atoms and second type dopant atoms. FIG. 17B shows a vertical cross-sectional view of the adjacent semiconductor layers $10_i$, $10_{i+1}$ after filling the trenches in the top (upper) semiconductor layer $10_{i+1}$ by forming at least one further epitaxial layer and after the annealing process.

Implanting both the first type dopant atoms and the second type dopant atoms into at least one of the first and second sidewall 14, 15, as shown in FIGS. 16A-16C and 17A-17C, may include at least two implantation processes, a first process in which first type dopant atoms are implanted into one of the two sidewalls, and a second process in which second type dopant atoms are implanted into the one of the two sidewalls. These two implantation processes may be repeated for implanting first type dopant atoms and second type dopant atoms into the other one of the two sidewalls. With regard to implanting dopant atoms of one type into one sidewall everything outlined above in context with FIGS. 11A and 11B applies equivalently. That is, dopant atoms of one type may be implanted into one sidewall in only implantation process using one implantation angle. This implantation angle may be chosen such that dopant atoms are implanted into the respective sidewall, but not the bottom. Alternatively, to obtain a varying doping profile, two or more implantation processes using mutually different implantation angles may be used to implant dopant atoms of one type into one sidewall. Further, the same implantation angle(s) may be used to implant dopant atoms of the first type into one sidewall and implanting dopant atoms of the second type into the one sidewall. Alternatively, different implantation angles are used for implanting first type dopant atoms and second type dopant atoms. Slower diffusing dopant atoms, for example, are implanted into deeper sidewall sections of the one sidewall than faster diffusing dopant atoms.

According to another example, the first type dopant atoms and the second type dopant atoms are implanted in in one sidewall in a common implantation process in which ions that include first type dopant atoms and second type dopant atoms are implanted. According to one example, these ions are antimony-boron ions (SbB+), so that the p-type dopant is boron and the n-type dopant is antimony. For implanting dopant atoms of both types into one sidewall only one common implantation process may be used. An implantation angle in this process may be selected such that dopant atoms are implanted into the sidewall, but not the bottom. According to another example, two or more common implantation processes are used to implant dopant atoms of both types into one sidewall.

In the methods explained above, forming a superjunction transistor device includes forming a plurality of semiconductor arrangements one above the other, wherein forming each of these semiconductor arrangements includes epitaxially growing a semiconductor layer, forming a plurality of trenches in the semiconductor layer, and implanting dopant atoms via at least one sidewall of the trenches into the semiconductor layer. This method or technology may be referred to as stacked trench technology because trenches are formed in several layers of a layer stack that includes several epitaxially grown semiconductor layers. The methods explained herein before for forming the individual semiconductor arrangements (labelled with $1_i$ herein before) in a superjunction device, however, are not restricted to be used in a method in which several semiconductor arrangements are formed one above the other. That is, it is also possible to form a superjunction device based on only one of the semiconductor arrangements of the type explained above. This is explained with reference to FIGS. 18A and 18B below.

Figure 18A:
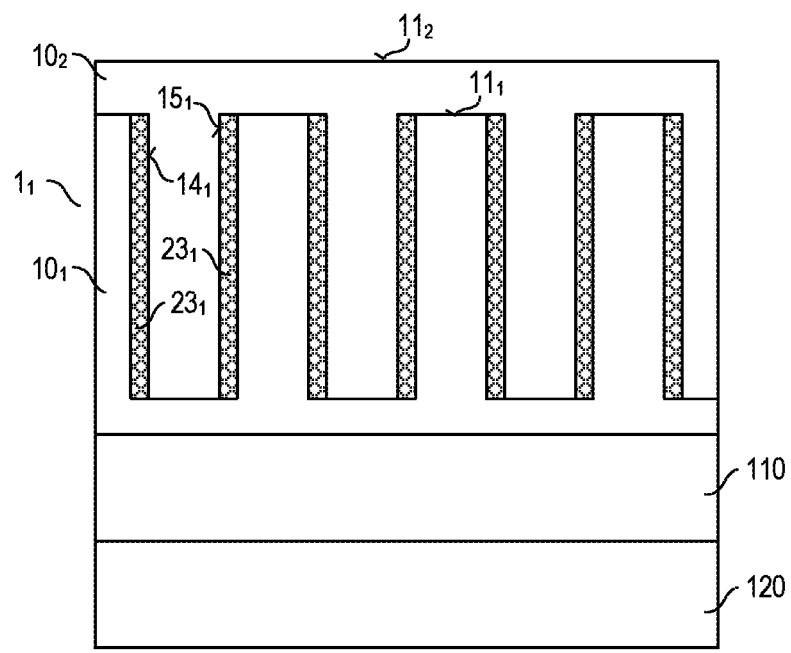
FIGS. 18A and 18B illustrate another example of a method for forming a superjunction transistor device.

FIG. 18A shows a vertical cross-sectional view of a semiconductor body that includes one semiconductor arrangement $1_1$. In particular, this semiconductor arrangement $1_1$ is of the type explained with reference to FIG. 17A and includes a first semiconductor layer $10_1$ with a plurality of doped regions $23_1$ that each include first type dopant atoms and second type dopant atoms. These implanted regions $23_1$ are arranged along sidewalls of former trenches which have been filled by growing a second semiconductor layer $10_2$ in the trenches and on a surface $11_1$ of the first semiconductor layer $10_1$. In the semiconductor body shown in FIG. 18A the semiconductor arrangement $1_1$ has been formed on an epitaxial layer 110 of the type explained above, wherein this epitaxial layer has been formed on a substrate 120 of the type explained above.

Figure 18B:
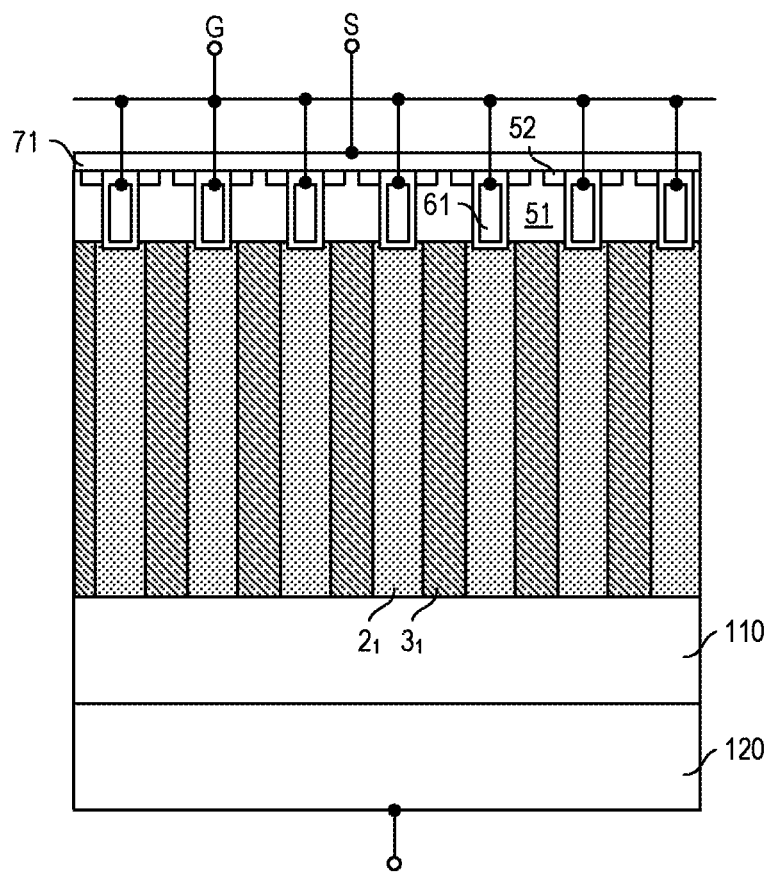

FIG. 18B shows a vertical cross sectional view of the semiconductor body after further process sequences that include annealing the semiconductor body to diffuse and activate the first type and second type dopant atoms in the doped regions $23_1$, forming body regions 51 and source regions 52 in the second semiconductor layer ($10_2$ in FIG. 18A), forming gate electrodes 61 and gate dielectrics 62 separating the gate electrodes 61 from the semiconductor body, and forming a source electrode 71 electrically connected to the source and body regions 51, 52. The annealing results in a plurality of doped first type regions $2_1$ and doped second type regions $3_1$ that are arranged alteratingly in a lateral direction of the semiconductor body. According to one example, the first type regions $2_1$ together with the epitaxial layer 110 form a drift region and the second type region form compensation regions of the superjunction device. Forming the source and body regions 51, 52 may include implanting dopant atoms via a surface ($11_2$ in FIG. 18A) into the second semiconductor layer ($10_2$ in FIG. 18A). In the example shown in FIG. 18B the gate electrodes 61 are implemented as trench electrodes. This, however, is only an example. Planar gate electrodes of the type shown in FIG. 5A may be used as well. In each case, the body regions 51 may be formed such that each body region 51 adjoins a compensation region.

Forming the source regions 51 and the body regions 52 shown in FIG. 18B may include implanting dopant atoms into the semiconductor body and activating the implanted dopant atoms in an annealing process. According to one example, this annealing process is additional to the annealing process in which the first type dopant atoms and the second type dopant atoms that form the drift regions and compensation regions are diffused and activated. In this example, the dopant atoms that form the source regions 51 and the body regions 52 are implanted after a first annealing process in which the first type dopant atoms and the second type dopant atoms that form the drift regions and compensation regions are diffused. The annealing process that activates the dopant atoms of the source and body regions 51, 52 may cause a further diffusion of the first type and second type dopant atoms in this example. According to another example, there is one common annealing process in which the first type dopant atoms and the second type dopant atoms that form the drift and compensation regions are diffused and activated and the dopant atoms that form the source and body regions 51, 52 are activated.

In the methods explained with reference to FIGS. 16A-16C, 17A-17B and 18A-18C above in which first type and second type (that is, n-type and p-type) dopant atoms are implanted into the same sidewall the these dopant atoms are selected such that they have different diffusion coefficients so that in the annealing process the dopant atoms "separate" and form doped first type regions with an effective doping concentration of the first type and doped second type regions with an effective doping concentration of the second type. If, for example, the first type dopant atoms diffuse slower than the second type dopant atoms the doped first type regions may include first type and second type dopants. The first type dopants, however, prevail so that there is an effective doping concentration of the first type. According to one example, this separation of first type dopant atoms and second type dopant atoms is enhanced by at least one of promoting the diffusion of the faster diffusing dopant atoms and reducing the diffusion of the slower diffusing dopant atoms.

Figure 19:
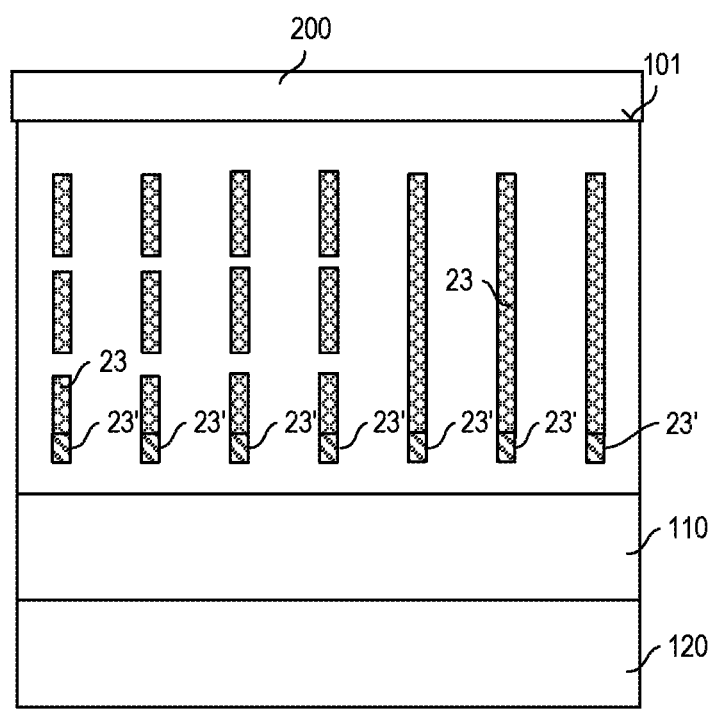
FIG. 19 shows one example of an annealing process that includes an oxidation.

According to one example, this enhancement in the separation of the first type dopant atoms and the second type dopant atoms in the diffusion process is obtained by generating interstitials in the crystal lattice of the semiconductor body during the diffusion process. One possible method for forming interstitials is explained with reference to FIG. 19. FIG. 19 shows a vertical cross-sectional view of a semiconductor body that includes a plurality of implanted regions 23 that each include first type dopant atoms and second type dopant atoms. These implanted regions 23 may result from a stacked trench process in which several implanted regions are formed one above the other, as schematically illustrated in the left section of FIG. 19, or these implanted regions 23 may result from forming only one semiconductor arrangement with trenches, as schematically illustrated in the right section of FIG. 19. Reference character 101 denotes a first surface of the semiconductor body, which is a surface of an uppermost semiconductor layer forming the semiconductor body. This surface is opposite a second surface formed by the substrate 120.

According to one example, the implanted regions 23 are produced such that they include first type dopant atoms and second type dopant atoms along their entire length in the vertical direction, that is, the direction perpendicular to the first surface 101. According to another example, the implanted regions 23 include sections 23' that terminate the implanted regions 23 in the direction of the substrate 120 and the optional epitaxial layer 110 and that include dopant atoms of only one of the first and second dopant type. These dopant atoms of only one of the first and second dopant type are those dopant atoms that diffuse slower. According to one example, those sections 23' include only antimony (Sb) and/or arsenic (As), while the remaining sections of the implanted regions 23 include antimony (Sb) and/or arsenic (As) and boron (B). A length of the sections 23' in the vertical direction is, for example, between 100 nanometers and several micrometers.

In the method illustrated in FIG. 19, the annealing process takes place in an oxidizing atmosphere which causes an oxidation layer 200 to grow at least on the first surface 101. The growth of this oxidation layer 200 is associated with the generation of interstitials at an interface between the oxide layer and the semiconductor body. These interstitials rapidly diffuse in the semiconductor body and may promote the diffusion of one type of dopant atoms. Interstitials, for example, promote the diffusion of boron, while at the same time they impede the diffusion of arsenic or antimony. According to one example, the oxidation and, therefore, the annealing takes place at temperatures selected from a range of between 800° C. and 1250° C., in particular between 950° C. and 1150° C. A duration of this annealing process is selected from a range of between 30 minutes and 10 hours, for example. According to one example, the oxidation takes place in a wet oxidation environment, in the presence of water vapor, for example. According to another example, the oxidation takes place in a dry oxidation environment. According to another example, the annealing process includes two or more oxidation processes, wherein the oxidation layer is at least partially removed from the surface between two oxidation processes.

Alternatively or additionally to forming interstitials by an oxidation process, interstitials may be formed by implanting non-doping particles into the at least one epitaxial layer with the implanted regions 23. Non-doping particles may include, but are not restricted to, oxygen ions, inert gas ions such as argon ions, electrons, and protons. In case of a stacked trench process in which two or more epitaxial layers are stacked one above the other non-doping particles may be implanted in each of these epitaxial layers. Implanting the non-doping particles into one epitaxial layer may include implanting the non-doping particles into the mesa regions and trenches. According to another example, the non-doping particles are implanted into the layer stack, that is, after the individual epitaxial layers have been formed. According to yet another example, the non-doping particles are implanted each time several of the epitaxial layers have been formed and before each of the epitaxial layers have been formed.

Referring to the above, forming one top semiconductor layer, such as semiconductor layer $10_{i+1}$ explained before, may include epitaxially growing this top semiconductor layer $10_{i+1}$ in trenches $12_i$ of the bottom semiconductor layer $10_i$, to completely fill the trenches $12_i$. According to one example, the trenches are formed such that they have third and fourth sidewalls at longitudinal ends that are inclined relative to the vertical direction z and the second lateral direction y, respectively. FIG. 20A shows a vertical cross-sectional view of one trench 12 of any of the semiconductor layers 10 in a longitudinal direction of the trench 12. Referring to FIG. 20A, the trench 12 at longitudinal ends includes a third sidewall 17 and a fourth sidewall 20A. These sidewalls are inclined relative to the vertical direction z and the second lateral direction y, respectively. In FIG. 20A, γ1 denotes an angle between the second lateral direction y and the third sidewall 17, and γ2 denotes an angle between the second lateral direction y and the fourth sidewall 18. According to one example, each of these angles γ1, γ2 is selected from between 20° and 60°. By forming the trench 12 with inclined third and fourth sidewalls a risk of forming voids when filling the trench 12 by epitaxially growing a top semiconductor layer can be reduced.

According to one example, edges of the third and fourth sidewalls between a bottom of the trench 12 and the first surface 11, respectively, are substantially perpendicular to the first and second sidewalls 14, 15. According to another example shown in FIG. 20B, which shows a top view of the trench shown in FIG. 20A, these edges are not perpendicular to the first and second sidewalls 14, 15. The third and fourth sidewalls 17, 18 themselves may be substantially perpendicular to the first and second sidewalls 14, 15 or may be inclined relative to these first and second sidewalls 14, 15.

Optionally, edges and corners of the trenches 12 explained before are rounded before forming the epitaxial layer in the trenches 12. Rounding edges and corners may include an annealing process in a hydrogen containing atmosphere. According to one example, this process takes place in the same process chamber in which the epitaxial layers are grown, before the respective epitaxial process. According to one example, a temperature in this "rounding process" is between 1130° C. and 1230° C., in particular between 1170° C. and 1190° C., and a duration is between 45 seconds and 75 seconds.

Referring to the above, forming the trenches in a top semiconductor layer, such as trenches $12_{i+1}$ in semiconductor layer $10_{i+1}$ may include adjusting positions of these trenches $12_{i+1}$ in a certain way relative to trenches in the respective bottom semiconductor layer, such as trenches $12_i$ in bottom semiconductor layer $10_i$. However, at the time of forming the trenches $12_{i+1}$ in the top semiconductor layer $10_{i+1}$, the trenches $12_i$ in the bottom semiconductor layer $10_i$ have been filled so that these trenches $12_i$ and, in particular, their position is not visible any more. According to one example, the method therefore includes forming an alignment structure in the bottom semiconductor layer $10_i$ at a defined position relative to the trenches $12_i$ in the bottom semiconductor layer $10_i$, wherein the alignment structure is formed such that the position of the alignment structure in the bottom semiconductor layer $10_i$ is also visible after forming the top semiconductor layer $10_{i+1}$. This is explained with reference to FIGS. 21A and 21B herein below.

FIG. 21A shows one section of the bottom semiconductor layer $10_i$ after forming at least one trench $61_i$ of an alignment structure. This at least one trench $61_i$, which can be referred to as alignment trench, is formed at a defined position relative to the plurality of trenches $12_i$ (not shown in FIG. 21A) formed in the bottom semiconductor layer $10_i$. According to one example, the trench $61_i$ of the alignment structure and the plurality of trenches $12_i$ are formed by the same etching process.

FIG. 21B shows the structure after forming the top semiconductor layer $10_{i+1}$ on top of the bottom semiconductor layer $10_i$. Referring to FIG. 21B, the top semiconductor layer $10_{i+1}$ has a recess $62_{i+1}$ at a position above the trench $61_i$. Based on the position of this recess $62_{i+1}$ the position of the trench $61_i$ in the bottom semiconductor layer $10_i$ can be located. As the trench $61_i$ is at a defined position relative to the positions of the trenches $12_i$ in the bottom semiconductor layer $10_i$, based on the recess $62_{i+1}$, the positions of the plurality of trenches $12_i$ in the bottom semiconductor layer $10_i$ can be located. Based on locating the position of these trenches $12_i$ the etch mask for forming the plurality of trenches $12_{i+1}$ in the top semiconductor layer $10_{i+1}$ can be positioned. According to one example, a width w2 of the trench $61_i$ is more than a thickness t of the top semiconductor layer, that is, w2>t.

According to one example, the alignment trench $61_i$ is part of a more complex alignment structure. This is explained with reference to FIGS. 22A and 22B each of which shows a top view of an alignment structure in the bottom semiconductor layer $10_i$. In the example shown in FIG. 22A, the trench $61_i$ forms one leg of a cross shaped alignment structure. In the example shown in FIG. 22B, the alignment trench $61_i$ is part of a grid shaped trench that encloses several mesa regions $62_i$.

Some aspects of the method explained above are summarized below.

Example 1

A method, including: forming at least one semiconductor arrangement, wherein forming the at least one semiconductor arrangement includes: forming a semiconductor layer; forming a plurality of trenches in a first surface of the semiconductor layer; and implanting dopant atoms of at least one of a first type and a second type into at least one of a first sidewall and a second sidewall of each of the plurality of trenches of the semiconductor layer.

Example 2

The method of example 1, wherein forming the at least one semiconductor arrangement includes forming a plurality of semiconductor arrangements one above the other.

Example 3

The method of example 1 or 2, wherein forming the semiconductor layer includes epitaxially growing the semiconductor layer.

Example 4

The method of any of examples 1 to 3, wherein epitaxially growing the semiconductor layer includes growing the semiconductor layer at a growth rate of higher than 500 nanometers per minute or higher than 1 micrometer per minute.

Example 5

The method of example 3 or 4, wherein the plurality of semiconductor arrangements includes at least one pair of semiconductor arrangements with a bottom semiconductor arrangement and a top semiconductor arrangement adjoining the bottom semiconductor arrangement, wherein forming the semiconductor layer of the top semiconductor arrangement includes forming the semiconductor layer in the plurality of trenches and on top of mesa regions between the plurality of trenches of the semiconductor layer of the bottom semiconductor arrangement.

Example 6

The method of example 5, wherein the top of the mesa regions includes monocrystalline semiconductor material.

Example 7

The method of one of examples 5 and 6, wherein epitaxially growing the top semiconductor layer includes epitaxially growing the top semiconductor layer until the first surface is substantially planar.

Example 8

The method of any combination of examples 1 to 7, wherein implanting the dopant atoms includes: implanting dopant atoms of the first type into the first sidewall and implanting dopant atoms of the second type into the second sidewall.

Example 9

The method of any combination of examples 1 to 7, wherein implanting the dopant atoms includes implanting dopant atoms of both the first type and the second type into at least one of the first sidewall and the second sidewall.

Example 10

The method of example 9, wherein implanting dopant atoms of both the first type and the second type includes implanting molecules that include dopant atoms of both the first type and the second type.

Example 11

The method of claim 10, further including: annealing the epitaxial layer so that dopant atoms of the first type and the second type diffuse in the epitaxial layer.

Example 12

The method of claim 11, further including: generating interstitials in the epitaxial layer.

Example 13

The method of claim 12, wherein generating the interstitials includes an oxidation process.

Example 14

The method of claim 13, wherein the oxidation process takes place during the annealing.

Example 15

The method of claim 12, wherein generating the interstitials includes implanting non-doping particles into the semiconductor layer before the annealing.

Example 16

The method of any combination of examples 1 to 15, wherein implanting the dopant atoms into at least one of the first sidewall and the second sidewall includes implanting the dopant atoms such that the at least one of the first sidewall and the second sidewall includes a sidewall section adjoining a bottom of the respective trench into which dopant atoms are not implanted.

Example 17

The method of any combination of examples 1 to 16, further including: before implanting the dopant atoms, forming an implantation mask on mesa regions between the plurality of trenches, wherein the implantation mask is configured to prevent dopant atoms from being implanted into the first surface.

Example 18

The method of example 17, wherein forming the plurality of trenches includes etching the plurality of trenches using an etch mask, and wherein the etch mask is used as the implantation mask.

Example 19

The method of any combination of examples 1 to 18, further including: implanting the dopant atoms of the least one of the first type and the second type into mesa regions between the plurality of trenches via the first surface; and after implanting the dopant atoms, at least partially removing sections of the mesa regions into which dopant atoms were implanted via the first surface.

Example 20

The method of any combination of examples 1 to 19, further including: forming a protection layer on a bottom of each of the plurality of trenches before implanting the dopant atoms; and removing the protection layer after implanting the dopant atoms.

Example 21

The method of any combination of examples 4 to 20, wherein the plurality of trenches of the top semiconductor arrangement are substantial aligned with the plurality of trenches of the bottom semiconductor arrangement.

Example 22

The method any combination of examples 4 to 20, wherein the plurality of trenches of the top semiconductor arrangement are offset in a lateral direction to the plurality of trenches of the bottom semiconductor arrangement.

Example 23

The method of example 22, wherein the plurality of trenches of the top semiconductor arrangement and the plurality of trenches of the bottom semiconductor arrangement of the bottom layer have substantially the same pitch, and wherein the offset is substantially 50% of the pitch.

Example 24

The method of example 22 or 23, wherein implanting the dopant atoms includes: implanting dopant atoms of the first type into the first sidewalls of the plurality of trenches of the bottom semiconductor arrangement; and implanting dopant atoms of the first type into the second sidewalls of the plurality of trenches of the top semiconductor arrangement.

Example 25

The method of example 22 or 23, wherein implanting the dopant atoms includes implanting dopant atoms of both the first type and the second type into both the first and second sidewalls of the plurality of trenches of the bottom semiconductor arrangement and into both the first and second sidewalls of the plurality of trenches of the top semiconductor arrangement.

Example 26

The method any combination of examples 1 to 25, wherein forming the trenches includes a wet etching process.

Example 27

The method of example 26, wherein the wet etching process includes using an alkaline etchant.

Example 28

The method of any combination of examples 1 to 27, wherein an aspect ratio of each of the plurality of trenches is between 10:1 and 1:1, or between 6:1 and 1:1.

Example 29

The method of any combination of examples 1 to 28, wherein a semiconductor material of the semiconductor layer is silicon, and wherein the first surface lies in a {110} plane of a crystal lattice of the semiconductor layer.

Example 30

The method of example 29, wherein forming the plurality of trenches includes forming the plurality of trenches such that both the first sidewall and the second sidewall lie in a {111} plane of the crystal lattice.

Example 31

The method of any combination of examples 1 to 28, wherein a semiconductor material of the semiconductor layer is silicon, and wherein the first surface lies in a {100} plane of a crystal lattice of the semiconductor layer.

Example 32

The method of example 31, wherein forming the plurality of trenches includes forming the plurality of trenches such that both the first sidewall and the second sidewall lie in a {100} plane of the crystal lattice.

Example 33

The method of any combination of examples 2 to 32, further including: annealing the plurality of semiconductor arrangement to diffuse the dopant atoms.

Example 34

The method of any combination of examples 2 to 33, wherein the plurality of semiconductor arrangements includes a first semiconductor arrangement, and wherein the semiconductor layer of the first semiconductor arrangement is formed on a semiconductor substrate.

Example 35

The method of any combination of examples 2 to 33, wherein the plurality of semiconductor arrangements includes a first semiconductor arrangement, and wherein the semiconductor layer of the first semiconductor arrangement is formed on an epitaxial layer with a substantially homogenous doping concentration.

Example 36

The method of any combination of examples 1 to 35, wherein the semiconductor layer of each of the plurality of semiconductor arrangements has a basic doping concentration of less than $8E13$ cm$^{-3}$, less than $5E13$ cm$^{-3}$, or less than $2E13$ cm$^{-3}$.

Example 37

The method of any combination any combination of examples 1 to 36, wherein the semiconductor layer of at least one of the plurality of semiconductor arrangements has an effective basic doping of one of the first type and the second type of higher than $1E14$ cm$^{-3}$.

Example 38

The method of any combination of examples 1 to 37, wherein implanting the dopant atoms includes implanting dopant atoms of the first type at a first implantation dose into at least one of the first sidewall and the second sidewall and implanting dopant atoms of the second type at a second implantation dose into at least one of the first sidewall and the second sidewall, wherein a magnitude of a difference between the first implantation dose and the second implantation dose is less than 20% of each of the first implantation dose and the second implantation dose.

Example 39

The method of any combination of examples 1 to 38, wherein implanting the dopant atoms includes implanting dopant atoms of at least one of the first type and the second type at a first implantation angle into the first sidewall and implanting dopant atoms of at least one of the first type and the second type at a second implantation angle into the second sidewall, wherein the first implantation angle and the second implantation angle substantially have the same magnitude.

Example 40

The method of any combination of examples 1 to 39, wherein each of the plurality of trenches has a width in a first lateral direction and a length in a second lateral direction perpendicular to the first lateral direction, and wherein the length is at least 10 times, at least 100 times, at least 1000 times, or at least 10000 times the width.

Example 41

The method of any combination of examples 1 to 40, wherein each of the plurality of trenches has a third sidewall at a first longitudinal end of the trench and a fourth sidewall at a second longitudinal end of the trench, wherein a magnitude of an angle between each of the third sidewall and the fourth sidewall and a bottom of the trench is between 20° and 60°.

Example 42

The method of any combination of examples 1 to 41, further including: forming an alignment structure in each of the plurality of semiconductor layers, wherein forming the alignment structure includes forming at least one alignment trench wider than each of the plurality of trenches.

Example 43

The method of any combination of examples 1 to 42, wherein implanting dopant atoms of the at least one of the first type and the second type into the least one of the first sidewall and the second sidewall of each of the plurality of trenches of the semiconductor layer includes at least two implantation processes that use different implantation angles.

Example 44

The method of any combination of examples 1 to 43, wherein implanting the dopant atoms includes implanting dopant atoms of one of the first and second type into deeper sidewall sections than dopant atoms of the other one of the first and second type.

Example 45

The method of claim 34, wherein implanting dopant atoms into trenches of the first semiconductor arrangement includes implanting dopant atoms of one of the first and second type into deeper sidewall sections than dopant atoms of the other one of the first and second type.

Example 46

A method including: forming one or more semiconductor arrangements, wherein forming each of the one or more semiconductor arrangements includes: forming a semiconductor layer; forming a plurality of trenches in a first surface of the semiconductor layer; implanting dopant atoms of a first type and a second type into at least one of a first sidewall and a second sidewall of each of the plurality of trenches of the semiconductor layer; and annealing the semiconductor layer so as to diffuse the first type dopants and the second type dopants, wherein the first type dopants and the second type dopants are selected such that they have different diffusion constants.

Example 47

The method of example 46, wherein forming the one or more semiconductor arrangements includes forming more than one semiconductor arrangements one above the other.

Example 48

The method of example 47, wherein annealing the semiconductor layer of each of the more than one semiconductor layers includes annealing each of the more than one semiconductor layers in a common annealing process.

Example 49

The method of any combination of examples 46 to 48, wherein implanting the dopant atoms of the first type and the second type includes implanting molecules that include dopant atoms of both the first type and the second type.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming at least one semiconductor arrangement, wherein forming the at least one semiconductor arrangement includes forming a semiconductor layer;
   forming a plurality of trenches in a first surface of the semiconductor layer; and
   implanting dopant atoms of at least one of a first type and a second type into at least one of a first sidewall and a second sidewall of each of the plurality of trenches of the semiconductor layer,
   wherein the at least one semiconductor arrangement comprises at least one pair of semiconductor arrangements with a bottom semiconductor arrangement and a top semiconductor arrangement adjoining the bottom semiconductor arrangement,
   wherein forming the semiconductor layer of the top semiconductor arrangement comprises forming a top semiconductor layer in the plurality of trenches and on top of mesa regions between the plurality of trenches of the semiconductor layer of the bottom semiconductor arrangement, and forming a plurality of trenches in the top semiconductor layer,
   wherein the plurality of trenches of the top semiconductor arrangement are substantially aligned with the plurality of trenches of the bottom semiconductor arrangement.

2. The method of claim 1, wherein forming the semiconductor layer comprises epitaxially growing the semiconductor layer.

3. The method of claim 2, wherein epitaxially growing the semiconductor layer comprises epitaxially growing the semiconductor layer until the first surface of the semiconductor layer is substantially planar.

4. The method of claim 1, wherein implanting the dopant atoms comprises:
   implanting dopant atoms of the first type into the first sidewall; and
   implanting dopant atoms of the second type into the second sidewall.

5. The method of claim 1, wherein implanting the dopant atoms comprises implanting dopant atoms of both the first type and the second type into at least one of the first sidewall and the second sidewall.

6. The method of claim 5, wherein implanting dopant atoms of both the first type and the second type into at least one of the first sidewall and the second sidewall comprises implanting molecules that include dopant atoms of both the first type and the second type into at least one of the first sidewall and the second sidewall.

7. The method of claim 5, further comprising:
   annealing the semiconductor layer so that dopant atoms of the first type and the second type diffuse in the semiconductor layer.

8. The method of claim 7, further comprising:
   generating interstitials in the semiconductor layer.

9. The method of claim 1, wherein forming the plurality of trenches comprises a wet etching process.

10. The method of claim 1, wherein an aspect ratio of each of the plurality of trenches is between 10:1 and 1:1, or between 6:1 and 1:1.

11. The method of claim 1, wherein a semiconductor material of the semiconductor layer is silicon, and wherein the first surface lies in a {110} plane of a crystal lattice of the semiconductor layer.

12. The method of claim 11, wherein forming the plurality of trenches comprises forming the plurality of trenches such that both the first sidewall and the second sidewall lie in a {111} plane of the crystal lattice.

13. The method of claim 1, further comprising:
   annealing the at least one pair of semiconductor arrangements to diffuse the dopant atoms.

14. The method of claim 1, wherein implanting the dopant atoms comprises:
   implanting dopant atoms of the first type at a first implantation dose into at least one of the first sidewall and the second sidewall; and
   implanting dopant atoms of the second type at a second implantation dose into at least one of the first sidewall and the second sidewall,
   wherein a magnitude of a difference between the first implantation dose and the second implantation dose is less than 20% of each of the first implantation dose and the second implantation dose.

15. The method of claim 1, wherein each of the plurality of trenches has a width in a first lateral direction and a length in a second lateral direction perpendicular to the first lateral direction, and wherein the length is at least 10 times, at least 100 times, at least 1000 times, or at least 10000 times the width.

16. The method of claim 1, wherein implanting dopant atoms of the at least one of the first type and the second type into the least one of the first sidewall and the second sidewall of each of the plurality of trenches of the semiconductor layer comprises at least two implantation processes that use different implantation angles.

17. The method of claim 1, wherein implanting the dopant atoms comprises implanting dopant atoms of one of the first and second type into deeper sidewall sections than dopant atoms of the other one of the first and second type.

18. A method of forming a semiconductor device comprising:
   forming a first semiconductor layer;
   forming a first plurality of trenches in the first semiconductor layer;
   implanting dopant atoms of at least one of a first type and a second type into at least one of a first sidewall and a second sidewall of each of the first plurality of trenches of the first semiconductor layer;
   forming a second semiconductor layer in the first plurality of trenches and on mesa regions between the first plurality of the trenches of the first semiconductor layer;
   forming a second plurality of trenches in the second semiconductor layer;
   implanting the dopant atoms of the at least one of a first type and a second type into at least one of a first sidewall and a second sidewall of each of the second plurality of trenches of the second semiconductor layer; and
   annealing the first and second semiconductor layers to diffuse the implanted dopant atoms to form alternating vertical regions of the first type and the second type.

19. The method of claim 18, wherein implanting the dopant atoms comprises:
   implanting dopant atoms of the first type into the first sidewalls of the first and second plurality of trenches; and implanting dopant atoms of the second type into the second sidewalls of the first and second plurality of trenches.

20. The method of claim 18, wherein implanting the dopant atoms comprises:
   implanting dopant atoms of the first type into the first sidewalls of the first and second plurality of trenches; and
   implanting dopant atoms of the first type into the second sidewalls of the first and second plurality of trenches.

21. The method of claim 18, wherein implanting the dopant atoms comprises:
   implanting dopant atoms of the first type and the second type into the first and second sidewalls of the first and second plurality of trenches.

22. The method of claim 18, further comprising:
   forming a third semiconductor layer in the second plurality of trenches and on mesa regions between the second plurality of the trenches of the second semiconductor layer;
   forming a third plurality of trenches in the third semiconductor layer;
   implanting the dopant atoms of the at least one of a first type and a second type into at least one of a first sidewall and a second sidewall of each of the third plurality of trenches of the third semiconductor layer; and
   annealing the first, second and third semiconductor layers to diffuse the implanted dopant atoms to form alternating vertical regions of the first type and the second type.

23. The method of claim 22, further comprising:
   forming a fourth semiconductor layer in the third plurality of trenches and on mesa regions between the third plurality of the trenches of the third semiconductor layer;
   forming a fourth plurality of trenches in the fourth semiconductor layer;
   implanting the dopant atoms of the at least one of a first type and a second type into at least one of a first sidewall and a second sidewall of each of the fourth plurality of trenches of the third semiconductor layer; and
   annealing the first, second, third and fourth semiconductor layers to diffuse the implanted dopant atoms to form alternating regions of the first type and the second type.

24. The method of claim 22, wherein the first plurality of trenches is offset in a lateral direction to the second plurality of trenches.

25. The method of claim 24, wherein the first plurality of trenches is substantially aligned with the third plurality of trenches.

26. A method, comprising:
   forming at least one semiconductor arrangement, wherein forming the at least one semiconductor arrangement includes forming a semiconductor layer;
   forming a plurality of trenches in a first surface of the semiconductor layer; and
   implanting dopant atoms of at least one of a first type and a second type into at least one of a first sidewall and a second sidewall of each of the plurality of trenches of the semiconductor layer,
   wherein the at least one semiconductor arrangement comprises at least one pair of semiconductor arrangements with a bottom semiconductor arrangement and a top semiconductor arrangement adjoining the bottom semiconductor arrangement,
   wherein forming the semiconductor layer of the top semiconductor arrangement comprises forming a top semiconductor layer in the plurality of trenches and on top of mesa regions between the plurality of trenches of the semiconductor layer of the bottom semiconductor arrangement, and forming a plurality of trenches in the top semiconductor layer to be filled with semiconductor material from a further semiconductor arrangement that adjoins the top semiconductor arrangement.

* * * * *